(12) United States Patent
Hieda et al.

(10) Patent No.: US 6,335,241 B1
(45) Date of Patent: Jan. 1, 2002

(54) SEMICONDUCTOR DEVICE AND MANUFACTURING METHOD THEREOF

(75) Inventors: Katsuhiko Hieda; Soichi Yamazaki, both of Yokohama; Kazuhiro Eguchi, Chigasaki; Kyoichi Suguro, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/369,174

(22) Filed: Aug. 5, 1999

(30) Foreign Application Priority Data

| Aug. 7, 1998 | (JP) | 10-224256 |
| Aug. 4, 1999 | (JP) | 11-221427 |

(51) Int. Cl.[7] .............................. H01L 21/8242
(52) U.S. Cl. ................... 438/253; 438/397; 438/387; 438/638
(58) Field of Search .................. 438/210, 239, 438/244, 245, 250, 253, 255, 396, 397, 241, 387, 381, 637, 638; 257/302, 303, 304, 305, 306, 307, 308, 309, 310

(56) References Cited

U.S. PATENT DOCUMENTS

| 5,849,618 A | * 12/1998 | Jeon | 438/254 |
| 6,043,146 A | * 3/2000 | Watanabe et al. | 438/623 |
| 6,066,541 A | * 5/2000 | Hsieh et al. | 438/397 |
| 6,097,051 A | * 8/2000 | Torii et al. | 257/306 |
| 6,114,200 A | * 9/2000 | Yew et al. | 438/253 |
| 6,130,124 A | * 10/2000 | Lee | 438/240 |
| 6,136,659 A | * 10/2000 | Schindler et al. | 438/386 |
| 6,169,009 B1 | * 1/2001 | Ju et al. | 438/396 |
| 6,171,970 B1 | * 1/2001 | Xing et al. | 438/706 |

OTHER PUBLICATIONS

Y. Kohyama et al., "A Fully Printable, Self–aligned and Planarized Stacked Capacitor DRAM Cell Technology for 1Gbit DRAM and Beyond," 1997 Symposium on VLSI Technology Digest of Technical Papers, pp. 17–18, (1997).
S. Yamamichi et al., "An ECR MOCVD (Ba,Sr) $TiO_3$ Based Stacked Capacitor Technology With $RuO_2$/Ru/TiN/$TiSi_x$ Storage Nodes for Gbit–scale DRAMs," IEDM Technical Digest 95, pp. 119–122, (1995).

* cited by examiner

*Primary Examiner*—Wael Faberry
*Assistant Examiner*—Fernando Toledo
(74) *Attorney, Agent, or Firm*—Finnegan, Henderson, Farabow, Garrett & Dunner, L.L.P.

(57) ABSTRACT

A semiconductor device with a charge holding capacitor comprises a lower electrode connected via a plug to one of the source and drain of an MIS transistor, a capacitor insulating film formed the lower electrode, an upper electrode formed on the capacitor insulating film. The lower electrode includes a first constituting portion that is embedded in a hole in which the plug has been embedded and so formed that it self-aligns with the plug and a second constituting portion which is formed on the first constituting portion and on regions outside the fist constituting portion and whose cross section is larger than that of the first constituting portion. The first constituting portion and the second constituting portion are formed integrally by a continues film.

5 Claims, 34 Drawing Sheets

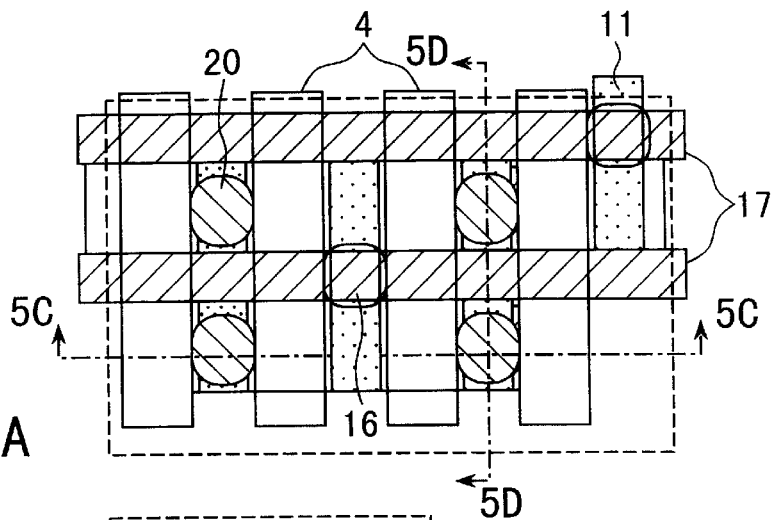
FIG. 5A
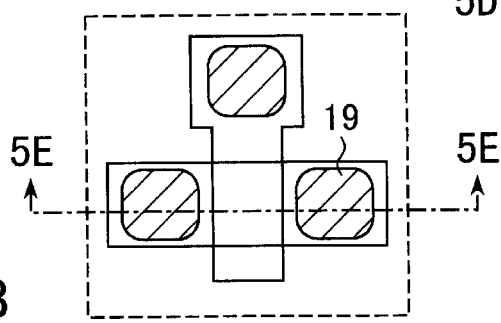
FIG. 5B
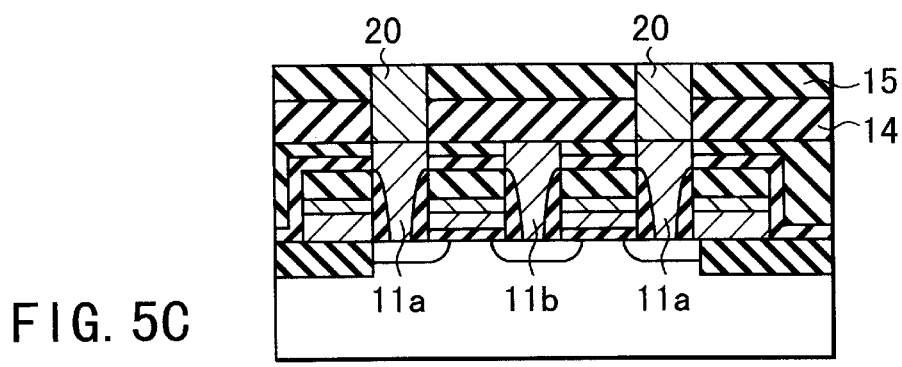
FIG. 5C
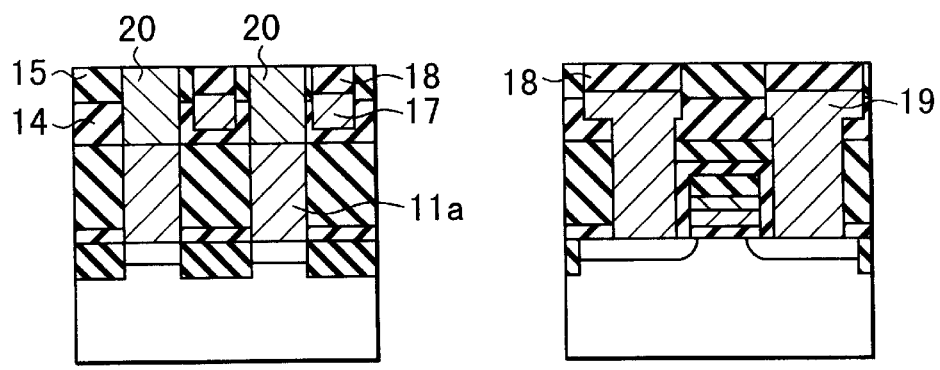
FIG. 5D
FIG. 5E

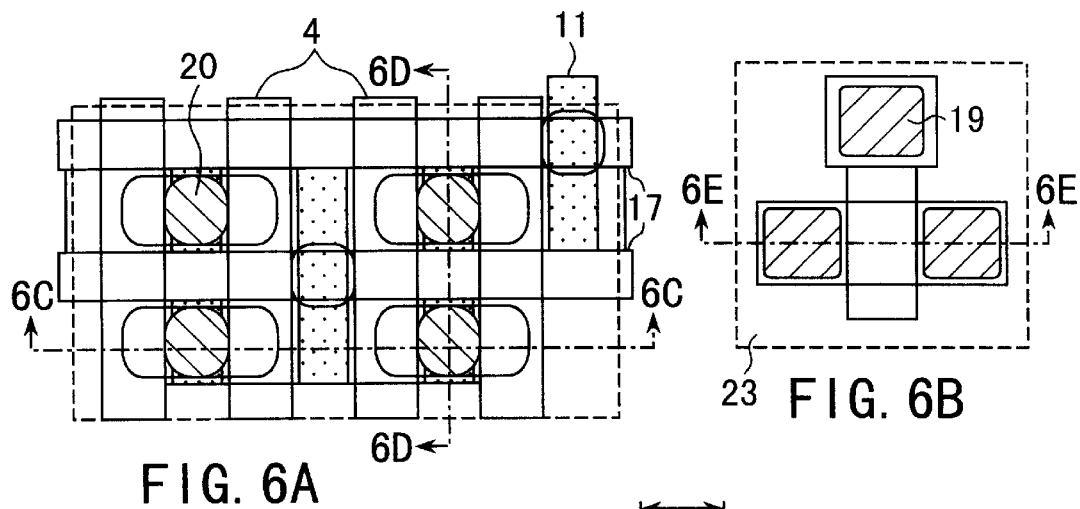
FIG. 6A
FIG. 6B
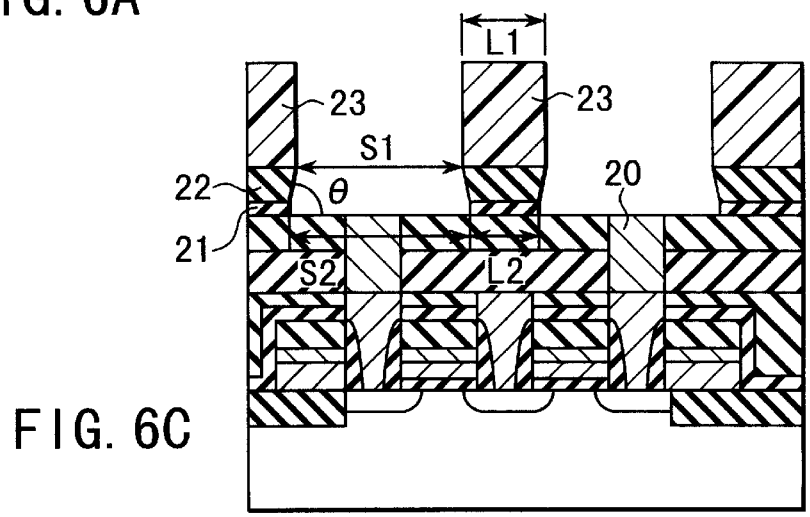
FIG. 6C
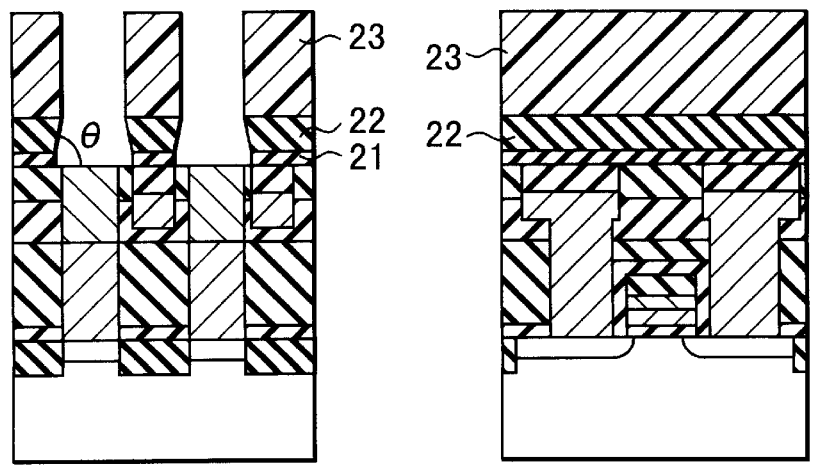
FIG. 6D
FIG. 6E

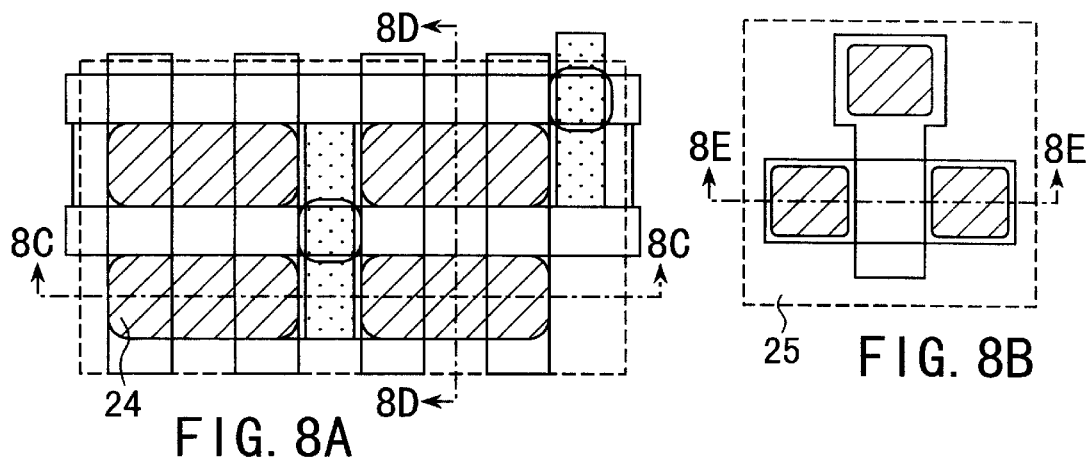
FIG. 8A
FIG. 8B
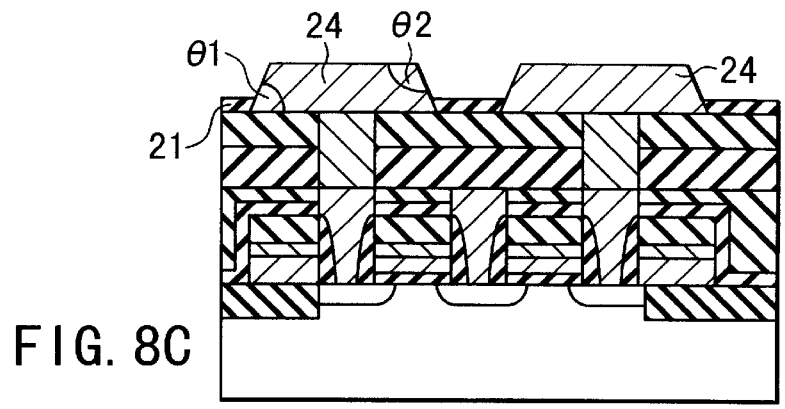
FIG. 8C
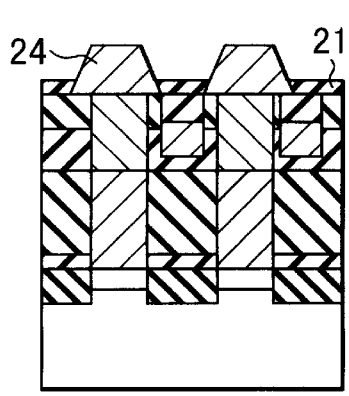
FIG. 8D
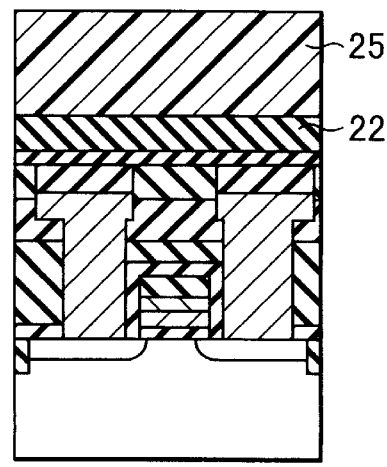
FIG. 8E

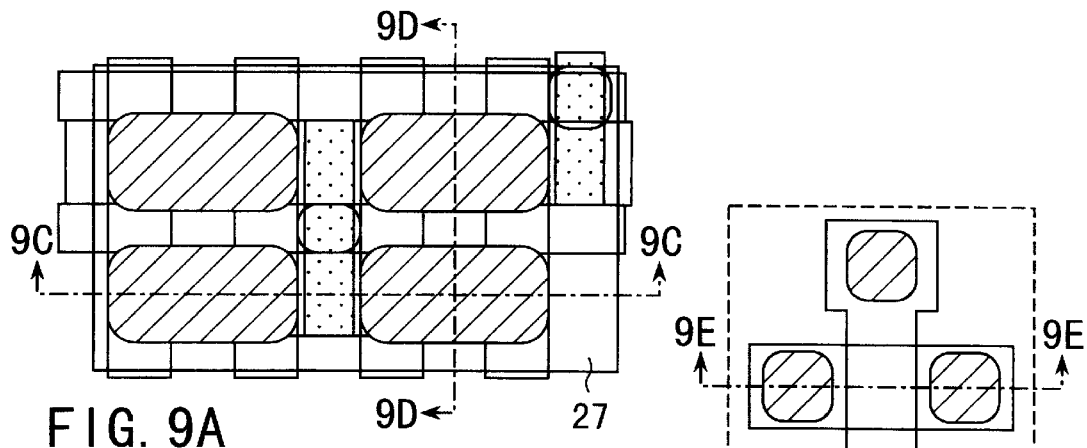
FIG. 9A
FIG. 9B
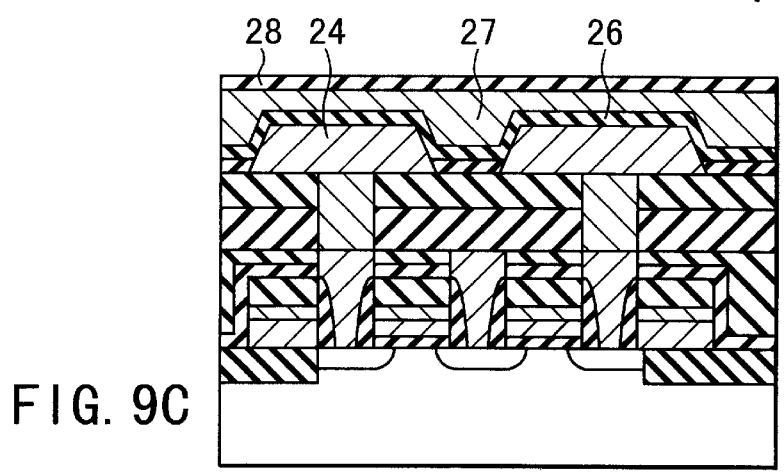
FIG. 9C
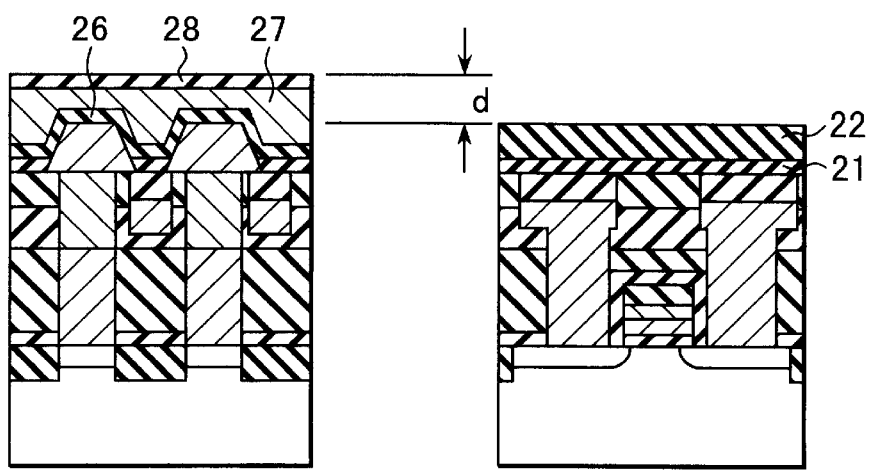
FIG. 9D
FIG. 9E

SEMICONDUCTOR DEVICE AND MANUFACTURING METHOD THEREOF

BACKGROUND OF THE INVENTION

This invention relates to a semiconductor device and a manufacturing method thereof, and more particularly to a stacked DRAM capacitor.

In recent years, as more and more circuit components have been squeezed into semiconductor integrated circuits, the minimum work dimensions have been getting smaller and the size of memory cells has been decreasing. As a result, the capacitor area in a memory cell has become very small. A decrease in the memory cell area results in a decrease in the capacity of the capacitor (storage capacity: Cs). The capacity of the capacitor has to be greater than a specific value from the viewpoints of sensitivity, soft errors, and noise in circuits.

The following two methods of increasing the capacity of a capacitor have been examined. A first method is to make the surface area of a capacitor as large as possible by forming the capacitor three-dimensionally. A second method is to use a high-permittivity insulating film (what is called a high E film) as a capacitor insulating film.

After the generations of design rules of 0.15 microns or less (or after the 1-GB DRAM generation), the processing of complex three-dimensional storage node electrodes (SN electrodes) has become increasingly difficult. Therefore, the method of using a high-permittivity insulating film as a capacitor insulating film is very important in making the capacity of a capacitor greater.

A typical high-permittivity insulating film is a (Ba, Sr)$TiO_3$ (hereinafter, abbreviated as BST) film. For use of a BST film, the idea of using an Ru film, whose oxide is conductive (e.g., an $RuO_2$ film is conductive), or a stacked film of $RuO_2$ film/Ru film as an SN electrode has been examined (see S. Yamamichi, et al., "Technical Digest," IEDM, 1995, pp. 119–122). Hereinafter, a stacked DRAM capacitor having such a structure will be explained by reference to FIG. 37.

First, element isolating regions 102 are formed at the surface of a p-type Si substrate 101. Thereafter, a gate insulating film 103a, a gate electrode (a polycrystalline silicon film 103b and a WSi film 103c), an SiN film 104, a source/drain diffused layer 105, an SiN film 106, and an interlayer insulating film 108 are formed.

Next, polycrystalline silicon films 107a and 107b are embedded in an SN electrode contact region and a bit-line contact region. Thereafter, interlayer insulating films 109 and 111 are formed and a bit line 110 and an SN contact are formed.

Then, a $TiSi_x$ film 113, a TiN film 114, an Ru film 115, and an $RuO_2$ film 116 are stacked. These stacked layers are patterned by normal lithographic techniques and RIE techniques to form an SN electrode. Thereafter, a high-permittivity insulating film 117, such as a BST film, is formed and then an upper electrode 118 (e.g., a stacked layer film of TiN film/Al film) is formed.

When the SN electrode is formed by the above conventional manufacturing method, the following problems arise.

When the SN electrode is formed by ordinary lithographic techniques and RIE techniques, the top corners of the SN electrode have right angles (or sometimes acute angles). This permits an electric field to concentrate at the top corners, resulting in an increase in leakage current in the capacitor insulating film. As a result of the SN electrode being patterned by RIE techniques, roughness of the side faces of the resist are amplified and transferred to the side faces of the SN electrode. The roughness of the side faces of the SN electrode increases leakage current in the capacitor insulating film.

Furthermore, the formation of the SN electrode by lithographic techniques makes the SN electrode liable to shift in position. Therefore, when the capacitor insulating film is formed, part of the plug can be exposed. Consequently, in forming a BST film serving as a capacitor insulating film, the metal plug can be oxidized. The oxidization of the metal plug would cause the following problems: a poorer electrical connection between the SN electrode and the plug and the plug film more liable to come off due to volume expansion caused by oxidation. To overcome these problems, a method of forming a barrier metal layer on the surface of the plug has been proposed. This method, however, has the following problems: the barrier metal has insufficient resistance to oxidation and the number of processes of manufacturing the barrier metal layer increases.

Moreover, when the SN electrode is formed on the plug and insulating film, it is desirable that such an SN electrode material should be used as has not only good electrical connection with the plug but also good adhesion to the insulating film. However, it is difficult to form an SN electrode that meets both of the requirements.

As described above, the conventional stacked DRAM capacitor has several problems stemming from the structure of the SN electrode and the manufacturing method and is not necessarily acceptable in terms of the electrical characteristics and reliability of the capacitor.

BRIEF SUMMARY OF THE INVENTION

It is, accordingly, an object of the present invention to provide a semiconductor device with capacitors excellent in electrical characteristics and reliability and a manufacturing method thereof.

According to a first aspect of the present invention, there is provided a semiconductor device with a charge holding capacitor, the capacitor comprising, a lower electrode connected to one of the source and drain of an MIS transistor; a capacitor insulating film formed on the top face and side faces of the lower electrode; and an upper electrode formed on the capacitor insulating film, wherein the side faces of the lower electrode are so formed that they widen gradually as they go downward, and the side faces near the bottom of the lower electrode are in contact with an insulating film different from the capacitor insulating film.

With the invention, since the side faces of the lower electrode (corresponding to a storage node electrode) are so formed that they widen gradually as they go downward, the top corners of the lower electrode have an obtuse angle. This alleviates the concentration of electric field at the top corners, reducing leakage current in the capacitor insulating film. The improved coverage of the capacitor insulating film promotes the thinning of the capacitor insulating film, which increases the capacity of the capacitor. Furthermore, the uniformity of the film thickness of the upper electrode (corresponding to the plate electrode) is improved, providing the stable capacitor. Moreover, the increased side face area of the lower electrode increases the capacity of the capacitor.

In the first aspect of the invention, the side faces near the bottom of the lower electrode are in contact with the insulating film different from the capacitor insulating film. When the side faces of the lower electrode are so formed that they widen gradually as they go downward, the bottom corners of the lower electrode have an acute angle, which may permit an electric field to concentrate there. In the first aspect of the invention, because the insulating film is in contact with the bottom corners, the leakage current in the capacitor insulating film caused by the concentration of electric field is suppressed.

As described above, with the first aspect of the invention, not only does leakage current in the capacitor is reduced, but the capacity of the capacitor is also increased. Consequently, it is possible to provide a stacked DRAM excellent in reliability and characteristics.

According to a second aspect of the invention, there is provided a method of manufacturing semi-conductor device, comprising: the step of forming an insulating film on a substrate in which an MIS transistor has been formed; the step of removing part of the insulating film to make a hole whose side faces widen gradually as they go downward; the step of embedding in the hole a conducting film that is connected to one of the source and drain of the MIS transistor and is to make a lower electrode of a capacitor; the step of removing the insulating film to expose at least part of the side faces of the conducting film; the step of forming a capacitor insulating film on the top face of and the exposed side faces of the conducting film; and the step of forming an upper electrode of the capacitor on the capacitor insulating film.

In the second aspect of the invention, because the lower electrode is formed by embedding the conducting film in the hole made in the insulating film, the side faces of the lower electrode are made flat and smooth. This prevents roughness of the side faces of the lower electrode from increasing leakage current in the capacitor insulating film.

In the second aspect of the invention, the step of removing part of the insulating film to make a hole whose side faces widen gradually as they go downward may includes: the step of making a first hole whose side faces widen gradually as they go downward by removing part of the insulating film; and the step of making a second hole by etching the insulating film in which the first hole has been made to enlarge the first hole.

Because the lower electrode is formed in the second hole made by enlarging the first hole, the dimensions of the lower electrode are greater than the dimensions determined by lithography. As a result, the surface area of the lower electrode is increased, which increases the capacity of the capacitor.

According to a third aspect of the invention, there is provided a semiconductor device with a charge holding capacitor, the capacitor comprising, a lower electrode connected to one of the source and drain of an MIS transistor; a capacitor insulating film formed on the top face and side faces of the lower electrode; and an upper electrode formed on the capacitor insulating film, wherein the side faces near the bottom of the lower electrode are recessed and the recessed portions are in contact with an insulating film different from the capacitor insulating film.

In the third aspect of the invention, the insulating film has eaten into the recessed portions of the side faces near the bottom of the lower electrode. Consequently, the adhesion of the lower electrode to the underlying region is improved, as compared with the case where the whole bottom surface of the lower electrode is formed on the flat surface. This makes it possible to construct a highly reliable stacked DRAM.

In the third aspect of the invention, the side faces higher than the recessed portions of the lower electrode may be so formed that they widen gradually as they go downward.

This structure not only decrease leakage current in the capacitor but also increase the capacity of the capacitor. Therefore, it is possible to provide a stacked DRAM excellent in reliability and characteristics.

According to a fourth aspect of the present invention, there is provided a method of manufacturing semiconductor device, comprising: the step of forming a first insulating film on a substrate in which an MIS transistor has been formed and a second insulating film on the first insulating film; the step of removing part of the first and second insulating films to make a first hole; the step of forming a second hole by selectively etching the second insulating film with reference to the first insulating film to enlarge the upper portion of the first hole; the step of embedding in the second hole a conducting film that is connected to one of the source and drain of the MIS transistor and is to make a lower electrode of a capacitor; the step of removing the second insulating film to expose at least part of the side faces of the conducting film; the step of forming a capacitor insulating film on the top face of and the exposed side faces of the conducting film; and the step of forming an upper electrode of the capacitor on the capacitor insulating film.

In the fourth aspect of the invention, because the lower electrode is formed by embedding the conducting film in the hole made in the insulating film, leakage current in the capacitor insulating film is prevented from increasing due to roughness of the side faces of the lower electrode, as in the second aspect of the invention. Furthermore, the lower electrode is formed in the second hole made by enlarging the first hole, which makes the dimensions of the lower electrode larger than the dimensions determined by lithography. As a result, the surface area of the lower electrode is increased, which increases the capacity of the capacitor.

According to a fifth aspect of the invention, there is provided a semiconductor device with a charge holding capacitor, the capacitor comprising, a lower electrode connected via a plug to one of the source and drain of an MIS transistor; a capacitor insulating film formed on the lower electrode; and an upper electrode formed on the capacitor insulating film, wherein a conducting film selected from a group consisting of a titanium nitride (TiN) film, a titanium aluminum nitride (TiAlN) film, a titanium silicon nitride (TiSiN) film, a tantalum silicon nitride (TaSiN) film, a ruthenium (Ru) film, an iridium (Ir) film, a stacked film of ruthenium film and ruthenium oxide film (the ruthenium oxide film is formed on the ruthenium film preferably), a stacked film of iridium film and iridium oxide film (the iridium oxide film is formed on the iridium film preferably), and a stacked film formed of any combination of these films (the titanium nitride film, the titanium aluminum nitride film, the titanium silicon nitride film, the tantalum silicon nitride film, the ruthenium film, the iridium film, the stacked film of ruthenium film and ruthenium oxide film, the stacked film of iridium film and iridium oxide film) is formed between the lower electrode and the plug in such a manner that it self-aligns with the plug.

In the fifth aspect of the invention, the conducting film excellent in oxidation resistance, such as titanium aluminum nitride, has been formed between the lower electrode and the plug in such a manner that it self-aligns with the plug. This prevents the exposed portion of the plug from being oxidized in forming the capacitor insulating film. As a result, a highly reliable stacked DRAM can be constructed.

According to a sixth aspect of the invention, there is provided a semiconductor device with a charge holding capacitor, the capacitor comprising, a lower electrode connected via a plug to one of the source and drain of an MIS transistor; a capacitor insulating film formed on the lower electrode; and an upper electrode formed on the capacitor insulating film, wherein a conducting film obtained by nitriding the plug is formed between the lower electrode and the plug in such a manner it self-aligns with the plug.

As with the fifth aspect of the invention, with the sixth aspect, the exposed portion of the plug is prevented from being oxidized in forming the capacitor insulating film. Use of the conducting film formed by nitriding the plug eliminates a lithographic process of forming the conducting film, simplifying the manufacturing processes.

According to a seventh aspect of the invention, there is provided a semiconductor device with a charge holding capacitor, the capacitor comprising, a lower electrode connected via a plug to one of the source and drain of an MIS transistor; a capacitor insulating film formed on the lower electrode; and an upper electrode formed on the capacitor insulating film, wherein the lower electrode includes a first conducting portion formed on the plug in such a manner that it self-aligns with the plug, and a second conducting portion formed on the side faces of or the side faces and top face of the first conducting portion.

In the seventh aspect of the invention, the first conducting portion is so formed that it self-aligns with the plug. This provides a good electrical connection between the lower electrode and the plug. Furthermore, the exposed portion of the plug is prevented from being oxidized in forming the capacitor insulating film.

According to an eighth embodiment of the invention, there is provided a method of manufacturing semi-conductor device, comprising: the step of forming an insulating film with a hole on a substrate in which an MIS transistor has been formed; the step of forming in the hole a plug connected to one of the source and drain of the MIS transistor in such a manner that the top face of the plug is positioned between the top and the bottom of the hole; the step of forming a first conducting film on the plug in the hole; the step of exposing at least part of the side faces of the first conducting film by removing part of the insulating film; the step of forming a second conducting film on the exposed side faces of or the exposed side faces and top face of the first conducting film; the step of forming a capacitor insulating film on a lower electrode of a capacitor composed of the first and second conducting films; and the step of forming an upper electrode of the capacitor on the capacitor insulating film.

According to a ninth aspect of the invention, there is provided a semiconductor device with a charge holding capacitor, the capacitor comprising, a lower electrode connected via a plug to one of the source and drain of an MIS transistor; a capacitor insulating film formed on the lower electrode; and an upper electrode formed on the capacitor insulating film, wherein the lower electrode includes a first constituting portion that is embedded in a hole in which the plug has been embedded and so formed that it self-aligns with the plug and a second constituting portion which is formed on the first constituting portion and on regions outside the fist constituting portion and whose cross section is larger than that of the first constituting portion, the first constituting portion and the second constituting portion being formed integrally by a continues film.

In the ninth aspect of the invention, the first constituting portion of the lower electrode is so formed that it self-aligns with the plug. This provides a good electrical connection between the lower electrode and the plug. Furthermore, the exposed portion of the plug is prevented from being oxidized in forming the capacitor insulating film. Moreover, because the first and second constituting portions are formed integrally by the continuos film, the adhesion of the lower electrode to the underlying region is improved, which provides a stacked DRAM excellent in reliability and characteristics.

In the ninth aspect of the invention, the side faces near the bottom of the second constituting portion of the lower electrode may be in contact with an insulating film different from the capacitor insulating film.

In the ninth aspect of the invention, the second constituting portion of the lower electrode may be so formed that the side faces widen gradually as they go upward.

In the ninth aspect of the invention, the second constituting portion of the lower electrode is so formed that the side faces widen gradually as they go downward.

According to a tenth aspect of the invention, there is provided a method of manufacturing semi-conductor device, comprising: the step of forming a first insulating film with a first hole on a substrate in which an MIS transistor has been formed; the step of forming in the first hole a plug connected to one of the source and drain of the MIS transistor in such a manner that the top face of the plug is positioned between the top and the bottom of the first hole; the step of forming a second insulating film with a second hole, the second hole being formed on a region corresponding to the first hole and on regions outside the first hole; the step of embedding a conducting film on the plug in the first hole and in the second hole; the step of exposing at least part of the side faces of the conducting film by removing the second insulating film; the step of forming a capacitor insulating film on the lower electrode of a capacitor composed of the conducting film; and the step of forming the upper electrode of the capacitor on the capacitor insulating film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A to 5E are plan views and sectional views showing part of the manufacturing processes according to the first embodiment;

FIGS. 6A to 6E are plan views and sectional views showing part of the manufacturing processes according to the first embodiment;

FIGS. 8A to 8E are plan views and sectional views showing part of the manufacturing processes according to the first embodiment;

FIGS. 9A to 9E are plan views and sectional views showing part of the manufacturing processes according to the first embodiment;

Figure 1A:
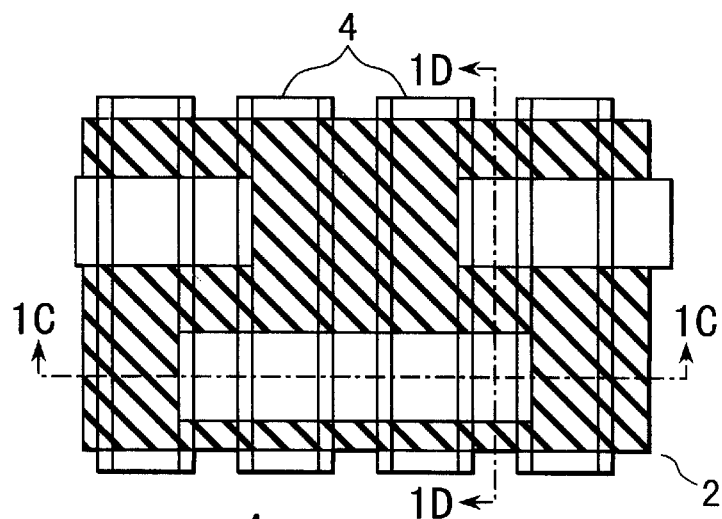
FIGS. 1A to 1E are plan views and sectional views showing part of the manufacturing processes according to a first embodiment of the present invention.
Figure 1B:
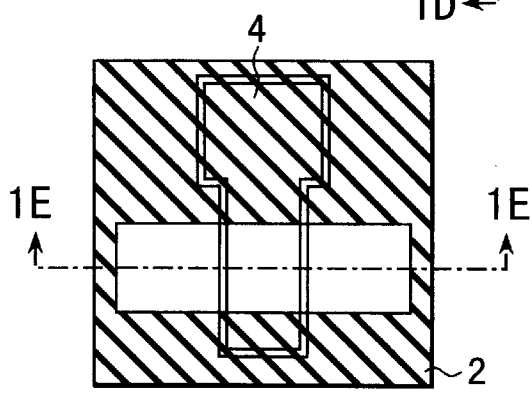
Figure 1C:
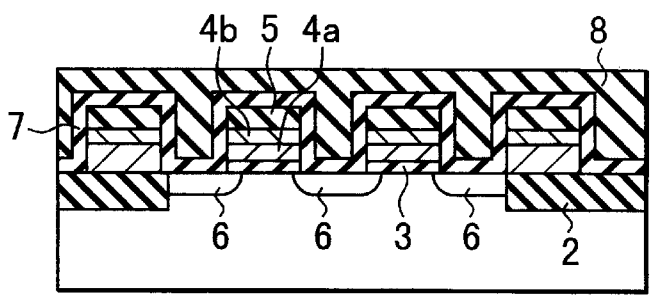
Figure 1D:
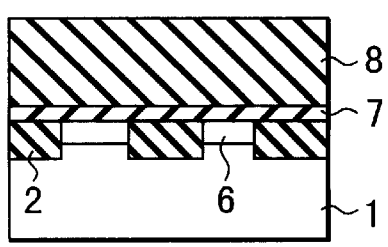
Figure 1E:
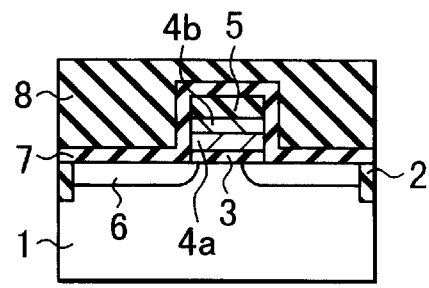
Figure 2A:
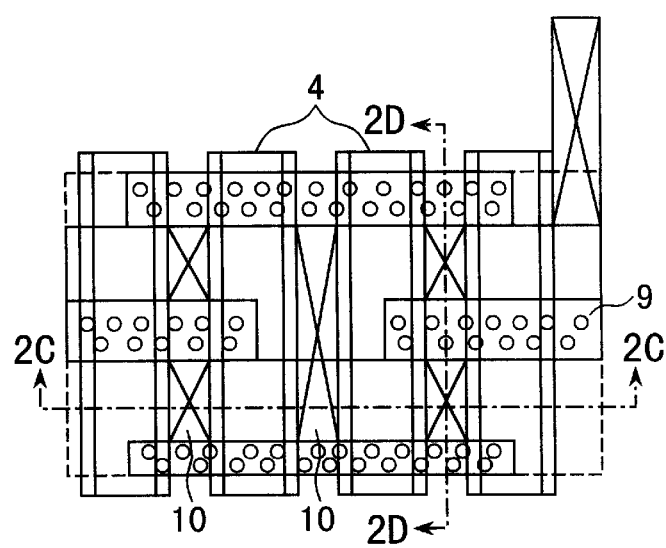
FIGS. 2A to 2E are plan views and sectional views showing part of the manufacturing processes according to the first embodiment.
Figure 2B:
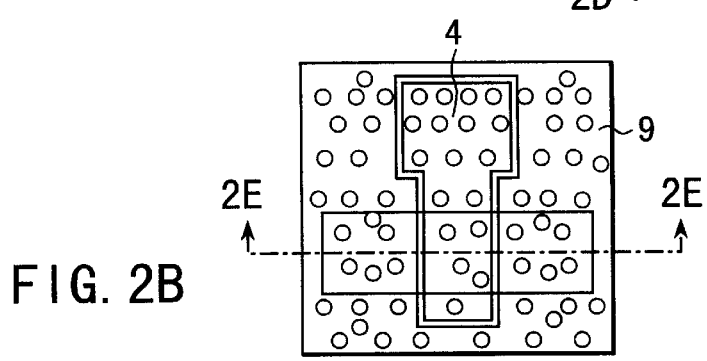
Figure 2C:
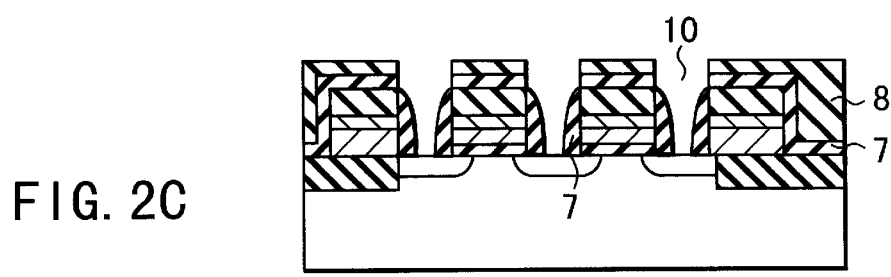
Figure 2D:
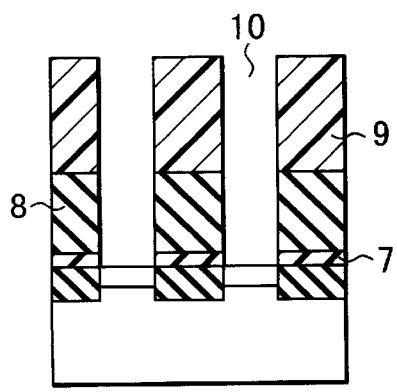
Figure 2E:
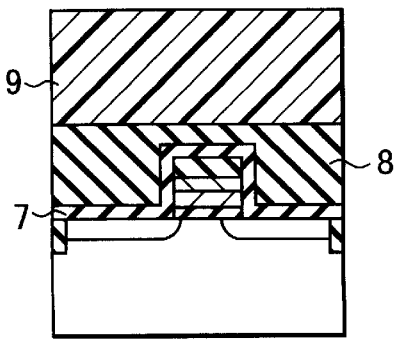
Figure 3A:
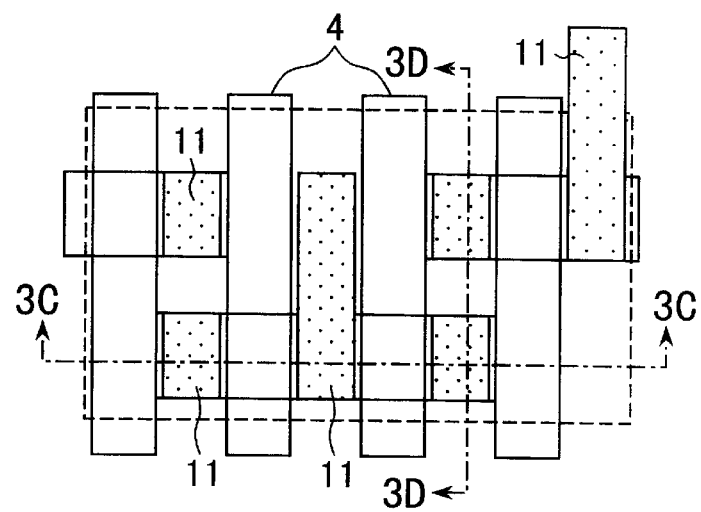
FIGS. 3A to 3E are plan views and sectional views showing part of the manufacturing processes according to the first embodiment.
Figure 3B:
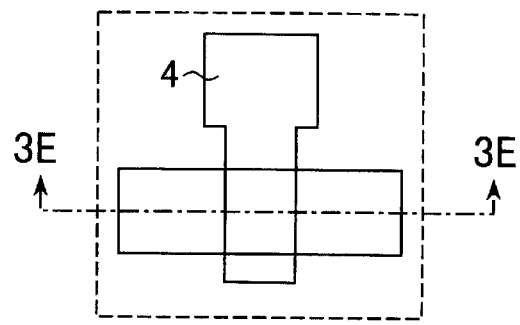
Figure 3C:
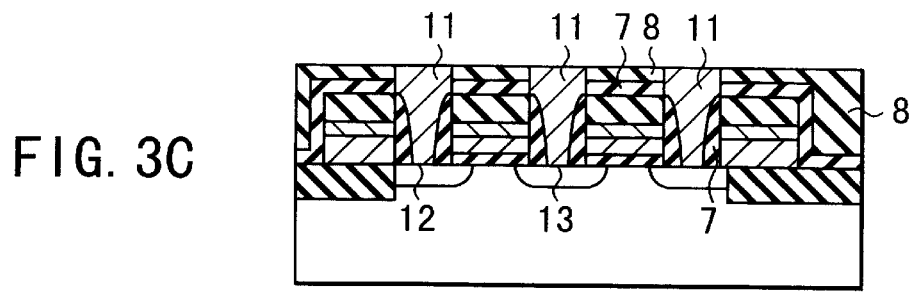
Figure 3D:
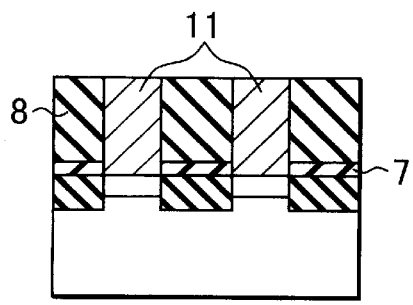
Figure 3E:
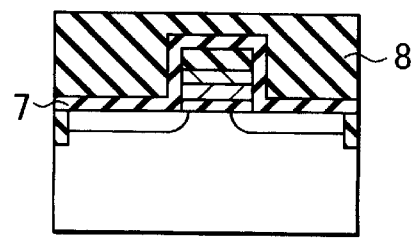
Figure 4A:
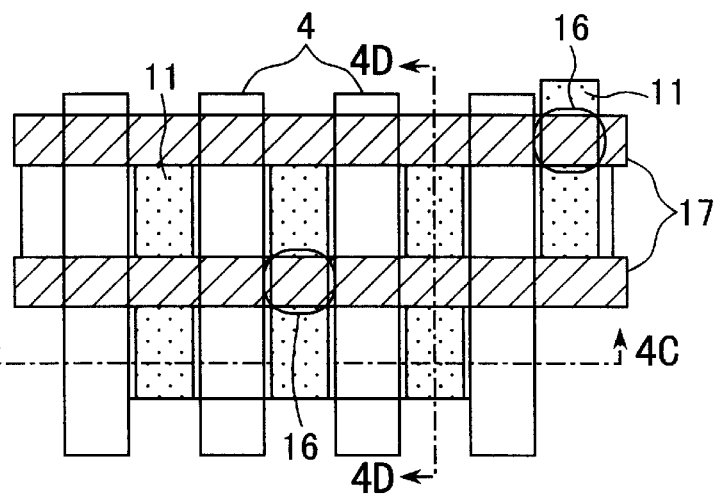
FIGS. 4A to 4E are plan views and sectional views showing part of the manufacturing processes according to the first embodiment.
Figure 4B:
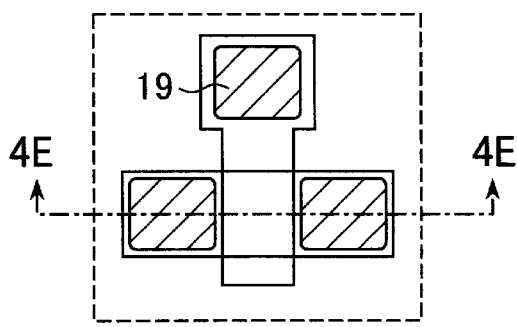
Figure 4C:
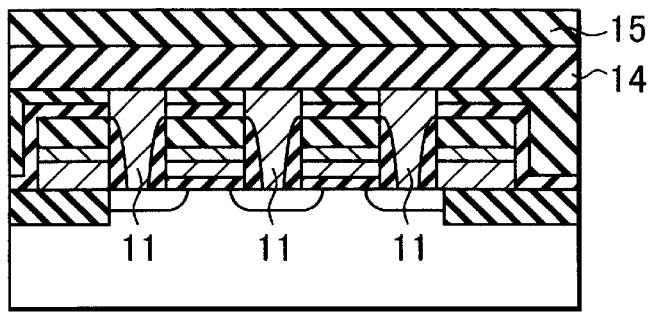
Figure 4D:
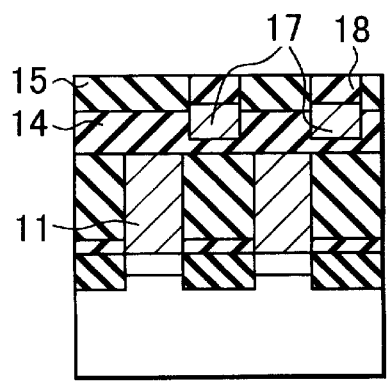
Figure 4E:
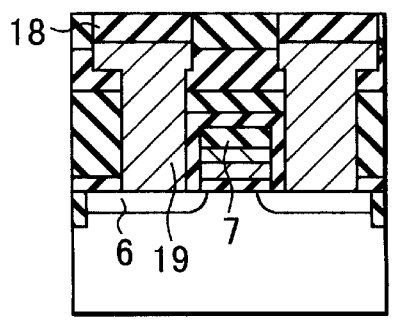
Figure 7A:
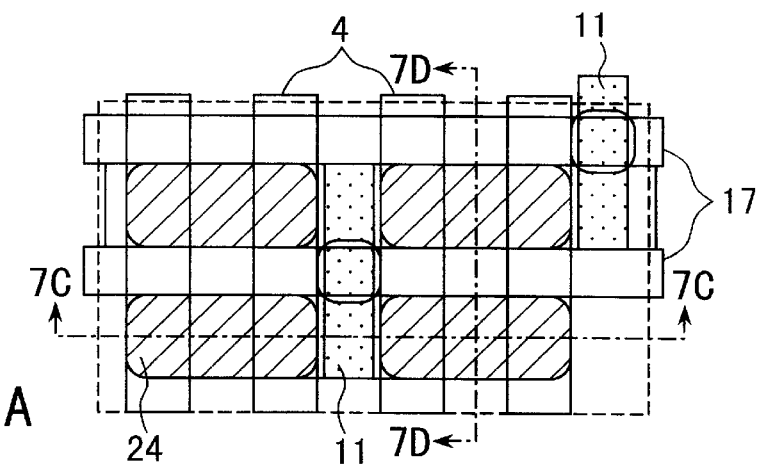
FIGS. 7A to 7E are plan views and sectional views showing part of the manufacturing processes according to the first embodiment.
Figure 7B:
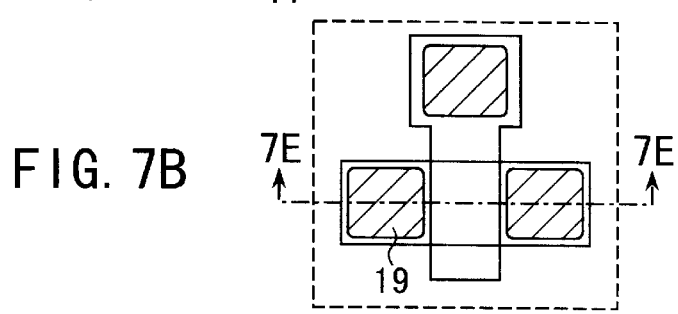
Figure 7C:
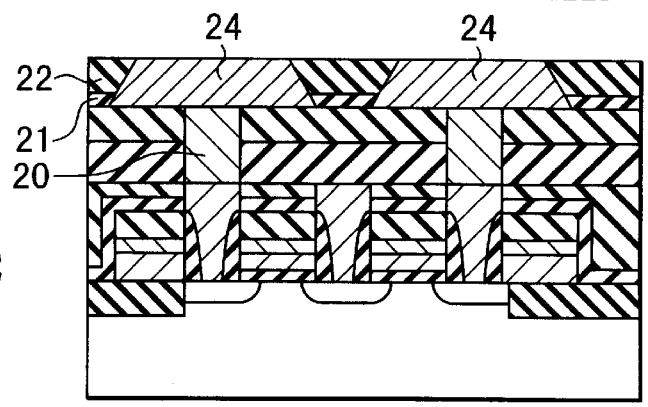
Figure 7D:
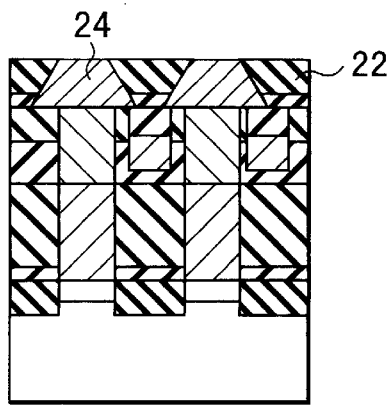
Figure 7E:
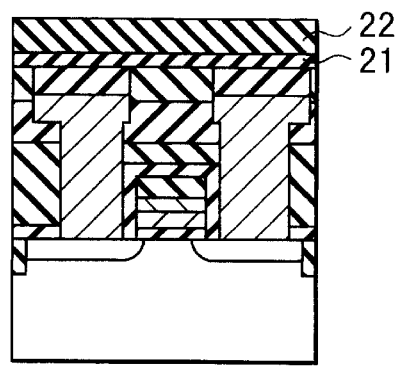
Figures 10A, 10B:
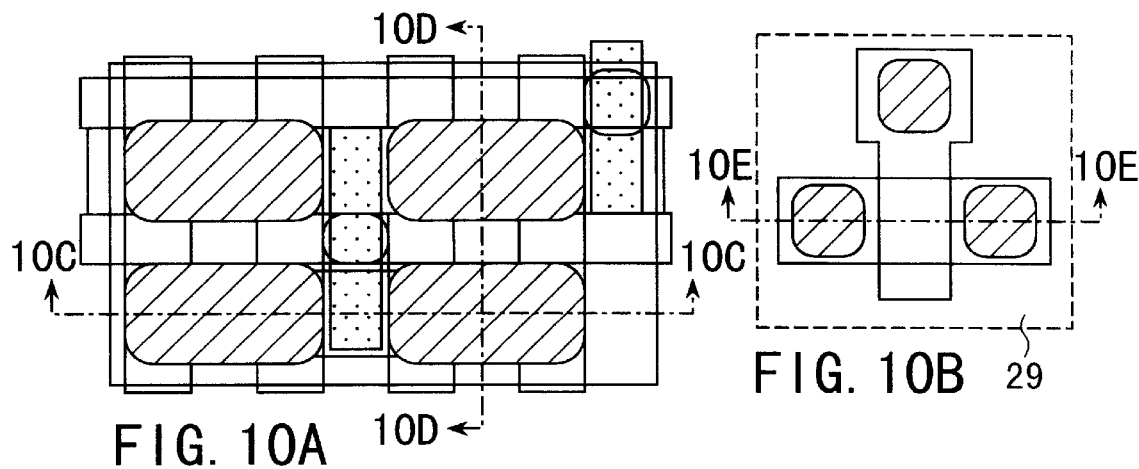
FIGS. 10A to 10E are plan views and sectional views showing part of the manufacturing processes according to the first embodiment.
Figure 10C:
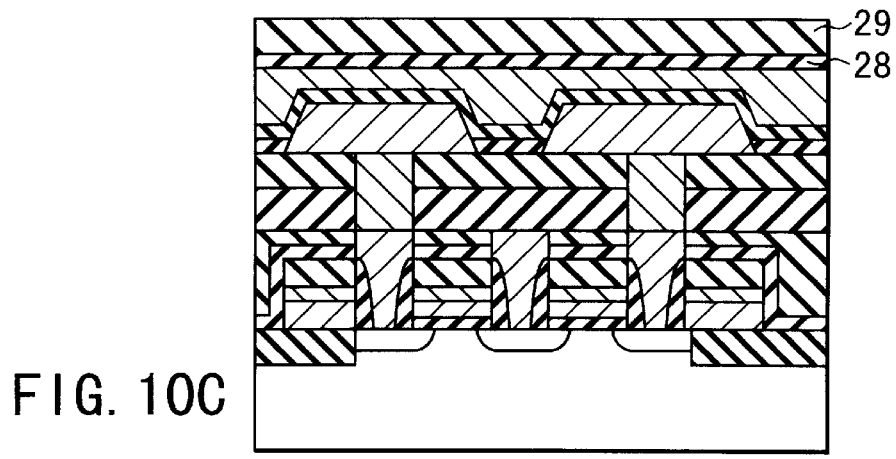
Figures 10D, 10E:
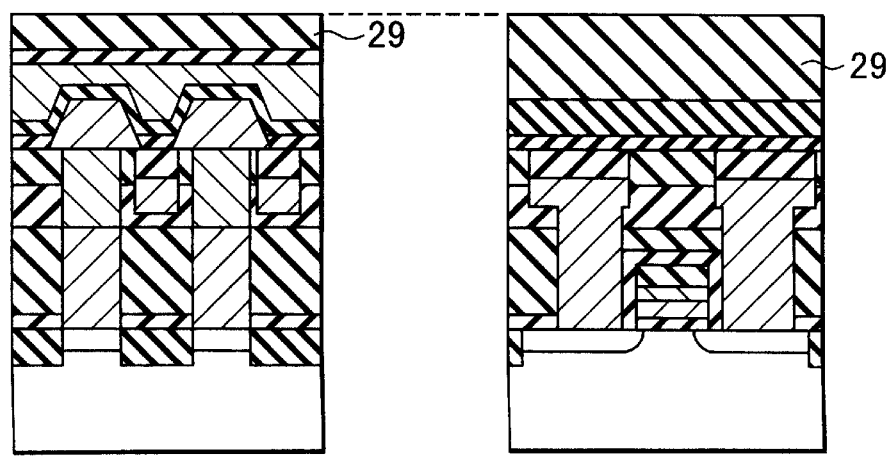
Figures 11A, 11B:
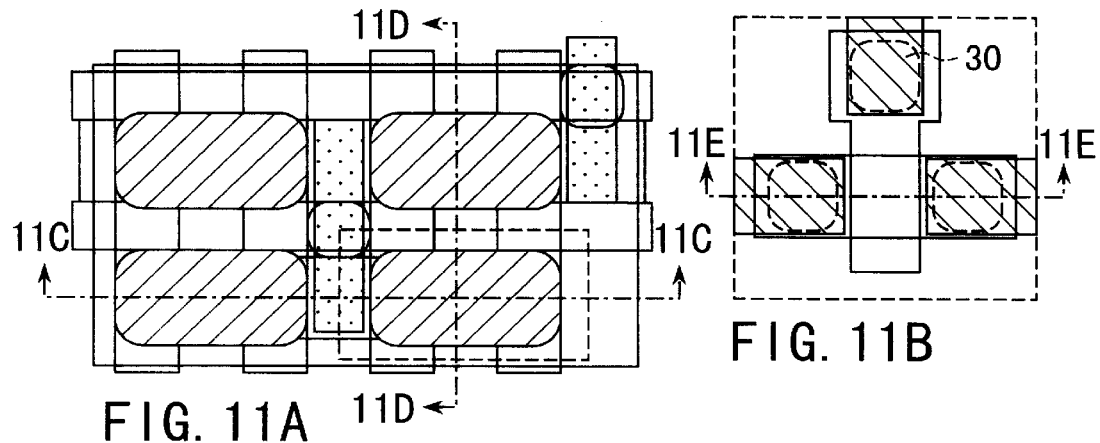
FIGS. 11A to 11E are plan views and sectional views showing part of the manufacturing processes according to the first embodiment.
Figure 11C:
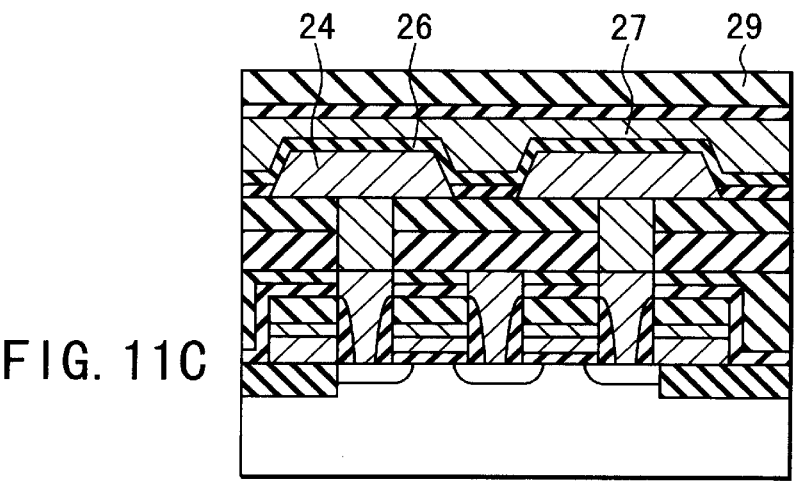
Figures 11D, 11E:
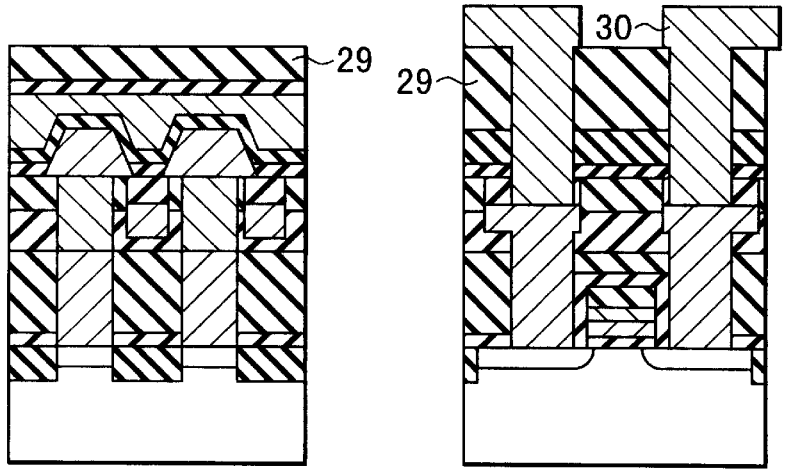
Figure 12A:
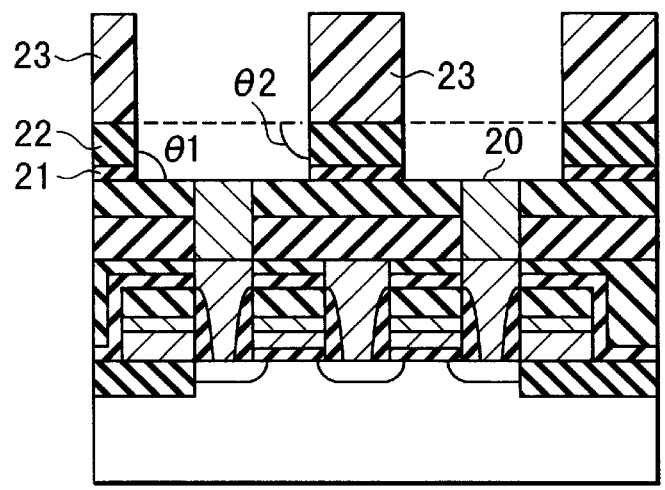
FIGS. 12A and 12B show an example of comparison in the first embodiment.
Figure 12B:
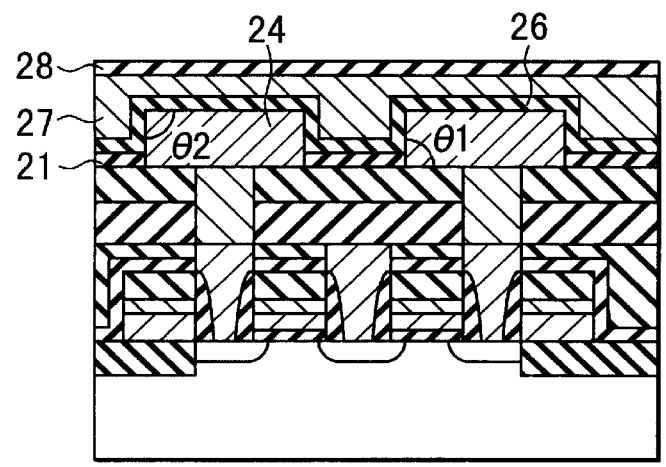
Figure 13A:
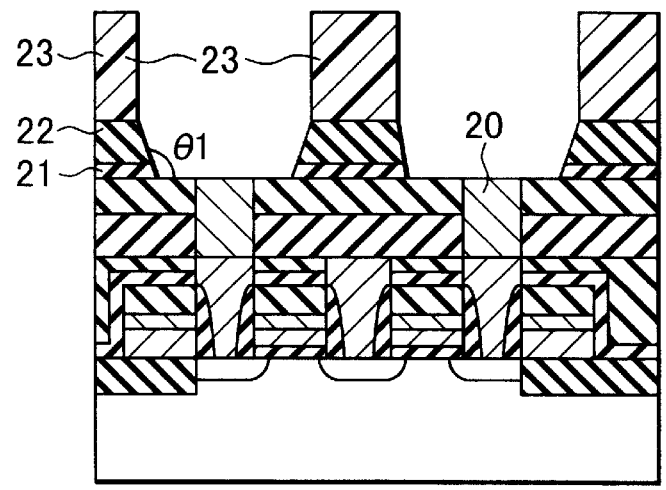
FIGS. 13A and 13B show an example of comparison in the first embodiment.
Figure 13B:
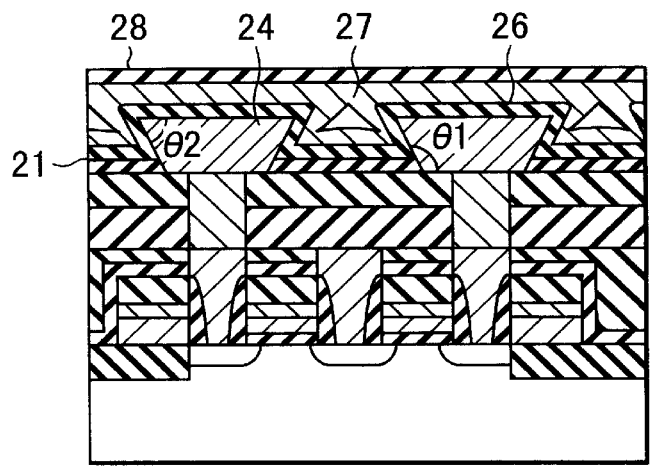

DETAILED DESCRIPTION OF THE INVENTION (First Embodiment)

FIGS. 1A to 1E to FIGS. 11A to 11E are views showing processes of manufacturing a stacked DRAM according to a first embodiment of the present invention. FIGS. 1A to 11A are plan views of a memory cell section, FIGS. 1B to 11B are plan views of a periphery circuit section, FIGS. 1C to 11C are sectional views taken along line 1C—1C to line 11C—11C in FIGS. 1A to 11A, respectively, FIGS. 1D to 11D are sectional views taken along line 1D—1D to line 11D—11D in FIGS. 1A to 11A, respectively, and FIGS. 1E to 11E are sectional views taken along line 1E—1E to line 11E—11E in FIGS. 1B to 11B, respectively.

The stacked DRAM of the first embodiment has basically the same structure as that of a conventional stacked DRAM except for the structure of a storage node electrode (SN electrode). The stacked DRAM of the first embodiment differs from a conventional stacked DRAM in that an SN electrode is formed by embedding a conducting film in a trench (or hole) made in an insulating film and the side faces of the SN electrode are tapered normally.

Explanation will be given as to a case where n-channel MOS transistors are used as the MOS transistors in the memory cell section and peripheral circuit section. The same is true when p-channel MOS transistors are used.

First, as shown in FIGS. 1A to 1E, a (100) oriented p-type silicon substrate 1 (or n-type silicon substrate) with an impurity concentration of about $5 \times 10^{15}$ cm$^{-3}$ is prepared. Then, a p-well is formed in an n-channel transistor region and an n-well is formed in a p-channel transistor region (not shown). Thereafter, a trench is made in the silicon substrate 1 by RIE (Reactive Ion Etching) techniques. By embedding an insulating film in the trench, an STI (Shallow Trench Isolation) region 2 (with a trench depth of about 0.2 μm) is formed.

Next, a silicon oxide film with a thickness of about 60 nm is formed as a gate insulating film 3 for a transistor. On the gate insulating film 3, a conducting film to make a gate electrode 4 is formed. The conducting film makes a word line 4 in a memory cell section. In the first embodiment, to reduce the resistance, the gate electrode 4 has a polycide structure (e.g., a stacked structure composed of a multilayer film of a polycrystalline silicon film 4*a* and a WSi$_2$ film 4*b*, the thickness of each of the polycrystalline silicon film 4*a* and WSi$_2$ film 4*b* being about 50 nm). Only a polycrystalline silicon film may be used for the gate electrode structure.

Alternatively, a stacked structure consisting of a polycrystalline silicon film and a W film may be used as the gate electrode structure.

The gate electrode 4 is processed as followed. First, a silicon nitride film ($Si_3N_4$ film) is formed as a gate cap film 5 on a conducting film to make a gate electrode. The gate cap film 5 will act as an etching stopper for the gate electrode in a later process. Thereafter, a resist pattern (not shown) is formed on the gate cap film 5. Then, with the resist pattern as a mask, the gate cap film 5 is processed. Thereafter, using the processed gate cap film 5 as a mask, the gate electrode 4 is processed.

Next, high-speed thermal oxidation is effected for about 100 seconds in an atmosphere of oxygen at 1050° C. by RTO (Rapid Thermal Oxidation) techniques to form what is called a post-oxidation film (not shown). This process is carried out to improve the breakdown voltage between the gate electrode 4 and an impurity diffused layer 6 (formed in a later process). Then, with a resist pattern (not shown) and gate electrode 4 as a mask, an $n^-$ impurity diffused layer 6 acting as source/drain is formed by ion implantation.

Next, a silicon nitride film 7 (with a thickness of, for example, about 20 nm) is deposited as a stopper film by LP-CVD techniques. Thereafter, a BPSG film is deposited as an interlayer insulating film 8 to a thickness of about 500 nm on the whole surface by CVD techniques. Thereafter, by CMP (Chemical Mechanical Polish) techniques, the interlayer insulating film 8 is polished flat. The polishing is so done that the interlayer insulating film 8 on the gate cap film 5 has a thickness of about 100 nm. By the CMP process, almost all the surface of the substrate is made flat.

For the source/drain, an $n^+$-type diffused layer may be formed in addition to the $n^-$-type diffused layer 6 as described below. After the $n^-$-type diffused layer 6 has been formed, a silicon nitride film (with a thickness of, for example, about 20 nm) is deposited on the whole surface by LP-CVD techniques. Thereafter, a sidewall film made of a silicon nitride film is formed on the sidewall portions of the gate electrode by RIE techniques. Then, using a resist mask, the sidewall film, and gate electrode as a mask, ions are implanted into the silicon substrate 1 to form an $n^+$-type source/drain diffused layer. Thereafter, a silicon nitride film (with a thickness of, for example, about 20 nm) is deposited as a stopper film on the whole surface by LP-CVD techniques.

Next, as shown in FIGS. 2A to 2E, a resist 9 is formed on the interlayer insulating film 8. With the resist 9 as a mask, etching is done to form a contact hole 10 for connecting the impurity diffused layer 6 to bit line and SN electrode.

In the contact hole etching, high selective ratio RIE techniques are used which achieves an etching rate of about 10 or more between the BPSG film used for the interlayer insulating film 8 and the silicon nitride film to make a stopper film 7 (that is, the etching speed of the BPSG film is set more than ten times as fast as that of the silicon nitride film). Use of such etching techniques prevents a short circuit between the gate electrode 4 and an $n^+$-type polycrystalline silicon film embedded in the contact hole 10 in a later process. Furthermore, use of the stopper film 7 on the gate electrode 4 and the resist film 9 in which a rectangular pattern has been formed makes the hole pattern rectangular, which increases the contact hole area.

Next, as shown in FIGS. 3A to 3E, an $n^+$-type polycrystalline silicon film into which impurities, such as phosphorus ($P^+$) or arsenic ($As^+$), have been doped is deposited on the whole surface by LP-CVD techniques. Then, by CMP or etch-back techniques, the $n^+$-type polycrystalline silicon film is left only in the contact holes to form polycrystalline silicon plugs 11. The polycrystalline silicon plugs 11 are electrically connected to the source/drain diffused layers to make an SN contact 12 and a BL contact 13.

Next, as shown in FIGS. 4A to 4E, a BPSG film is deposited as an interlayer insulating film 14 to a thickness of about 300 nm on the whole surface by CVD techniques. Thereafter, a TEOS oxide film (interlayer insulating film 15) is deposited as an etching stopper in CMP to a thickness of about 100 nm by CVD techniques.

Next, using usual lithographic techniques and RIE techniques, contact holes and trenches are made in the interlayer insulating films 14 and 15. By embedding conductive material in the contact holes and trenches, bit-line contacts 16 and bit lines (BL) 17 are formed. The bit-line contacts 16 and bit lines 17 electrically connect the polycrystalline silicon plugs 11 to the bit lines 17. To form the bit-line contacts 16 and bit lines 17, what is called a dual damascene process is used.

For example, a stacked layer consisting of a W film/TiN film/Ti film is embedded in line-like trenches (with a depth of about 350 nm). Next, the W film and others embedded in the trenches are etched about 100 nm. Then, an SiN film is deposited to a thickness of about 300 nm on the whole surface. Furthermore, an SiN film 18 is selectively embedded only on the W film to make bit lines 17 by CMP techniques or CDE (Chemical Dry Etching) techniques. At this time, in the contact region of the peripheral circuit section, contact holes and trenches are made beforehand. By doing this, contact plugs 19 electrically connected to the source/drain diffused layers are also formed in the peripheral circuit section at the same time bit-line contacts and bit lines are formed in the dual damascene process.

Next, as shown in FIGS. 5A to 5E, contact holes reaching the polycrystalline silicon plugs (SN plugs 11$a$) are made in the interlayer insulating films 14 and 15 by ordinary lithographic techniques and RIE techniques. Then, a stacked film of, for example, W film/TiN film/Ti film is deposited on the entire surface. Thereafter, by CMP techniques or the like, the W film/TiN film/Ti film on the interlayer insulating film 15 is removed, thereby embedding the W film/TiN film/Ti film only in the contact holes (hereinafter, the W film/TiN film/Ti film embedded in the contact holes are referred as W plugs). The W plug 20 is electrically connected to the source/drain diffused layer via the SN plug 11$a$. In forming the contact holes, a resist (not shown) and the SiN film 18 on the bit line 17 are used as a mask. This makes it possible to form very small contact holes in a small space between bit lines. At this stage, it is clear from the figures that both of the memory cell section and the peripheral circuit section are flat. As the plugs, an Ru film or an Ir film may be used.

Next, as shown in FIGS. 6A to 6E, a silicon nitride film 21 is deposited to a thickness of about 20 nm on the entire surface. Then, a TEOS oxide film 22 is deposited to a thickness of about 300 nm on the whole surface. Thereafter, a resist 23 in which an SN electrode forming region has a trench pattern is formed. With the resist 23 as a mask, the TEOS oxide film 22 and silicon nitride film 21 are etched by RIE techniques. As a result of the etching, the surface of the W plug 20 embedded in the interlayer insulating films 14 and 15 is exposed.

At this time, as shown in FIGS. 6C and 6D, the interlayer insulating films 21 and 22 are so etched that they have a normally tapered shape. In other words, etching is done in such a manner that the hole pattern of the SiN film 21 becomes greater than that of the resist 23. Specifically, if the dimension of the hole pattern at the bottom surface of the resist 23 is Si and the dimension at the surface of the interlayer insulating film 15 is S2, then S1<S2. The angle θ of the side faces of the interlayer insulating film 21 and 22 is an acute angle (for example, in the range from about 80° to 89°). The angle θ is determined, taking into account a short circuit between adjacent patterns and the embedding characteristic of the SN electrode.

In the etching process, the TEOS oxide film 22 may be etched by RIE techniques using the SiN film 21 as a stopper and then the SiN film 21 may be selectively etched. In this case, the peripheral circuit section and other regions are covered with the resist 23 beforehand as shown in FIG. 6E.

Next, as shown in FIGS. 7A to 7E, after the resist 23 has been removed, an Ru film is deposited to a thickness of about 400 nm on the whole surface by sputtering techniques or CVD techniques. Thereafter, a flattening process is carried out using CMP techniques or etch-back techniques to form an SN electrode 24 (the lower electrode of a capacitor) made of the Ru film. At this time, no step is produced between the memory cell section and the peripheral circuit section.

While the Ru film has been used as material for the SN electrode 24, an $RuO_2$ film, a Pt film, an Re film, an Os film, a Pd film, an Rh film, an Au film, an Ir film, an $IrO_2$ film, or a metal oxide film with a perovskite structure (e.g., $SRO(SrRuO_3)$ film) may be used. A stacked layer of these films may be used. Moreover, a film obtained by stuffing the grain of each of these metal films with another metal film (e.g., Rh or Ir) may be used.

Because the trench pattern in which the SN electrode is to be embedded has a reverse tapered shape, a hollow might appear in the SN electrode when the SN electrode is embedded. This is acceptable as long as the surface of the SN electrode is flat after CMP. The angle of the reverse taper may be adjusted so as to make the surface flat.

Next, as shown in FIGS. 8A to 8E, the peripheral circuit section and others are covered with a resist 25 and the TEOS oxide film 22 is selectively removed by using a wet etching solution, such as $NH_4F$ solution. At this time, etching is stopped by the SiN film 21 under the TEOS oxide film 22. In this state, the height of the surface of the SN electrode 24 in the memory cell section is the same as that of the TEOS oxide film 22 excluding the memory cell section. As a result, a step between the memory cell region and the region excluding the memory cell region can be eliminated to a negligible level. In the processes of manufacturing stacked DRAMs, it is important to make steps smaller.

The angle (θ2) of the top corners of the SN electrode 24 is an obtuse angle and the angle (θ1) of the lower corners is an acute angle. As a result, the concentration of electric field at the top corners of the SN electrode 24 is alleviated, which suppresses the deterioration of breakdown voltage of the capacitor insulating film. The lower corners of the SN electrode 24 are covered with the silicon nitride film 21. Consequently, the concentration of electric field at the lower corners is also alleviated, which suppresses the degradation of breakdown voltage of the capacitor insulating film.

The side faces of the SN electrode 24 are the transfer of the side faces of a trench made by etching the TEOS oxide film 22. Because the etching surface of the flat TEOS oxide film 22 is transferred onto the SN electrode, the side faces of the SN electrode can be made flat and smooth. When metal material is etched to form an SN electrode, the etching surface is hard to control and therefore it is difficult to obtain the flat, smooth side faces of the SN electrode. In the first embodiment, the side faces of the SN electrode are made flat and smooth, which suppresses the concentration of electric field due to roughness of the side faces of the SN electrode. Consequently, it is possible to suppress an increase in the leakage current in the capacitor insulating film.

As shown in FIGS. 9A to 9E, a BST film 26 to make a capacitor insulating film is deposited to a thickness of about 20 nm on the whole surface by CVD techniques. Then, on the BTS film 26, an Ru film to make the upper electrode (plate electrode 27) of a capacitor is deposited to a thickness of about 40 nm on the entire surface by CVD techniques. Thereafter, on the Ru film, a TiN film to make a cap film 28 is formed to a thickness of about 50 nm by sputtering techniques. After this, the plate electrode 27 and cap film 28 are patterned by ordinary lithographic techniques and RIE techniques. At this time, a step d takes place between a region without a plate electrode, such as the peripheral circuit section, and the memory cell section.

In addition to the Ru film, a noble metal, such as a Pt film, a Re film, an Ir film, and Os film, a Pd film, a Rh film, or an Au film, may be used as the plate electrode 27. Additionally, a metal oxide film of each of these noble metals may be used. Moreover, a metal oxide film with a perovskite structure, such as SRO, may be used. Additionally, a stacked film of these films may be used.

Next, as shown in FIGS. 10A to 10E, an interlayer insulating film 29, such as a plasma TEOS oxide film, is deposited to a thickness of about 400 nm on the whole surface by CVD techniques. Then, the entire surface is flattened by CMP techniques. This eliminates the step between the memory cell section and the peripheral circuit section.

Next, as shown in FIGS. 11A to 11E, a contact hole is made in a desired region and a metal interconnection 30 is formed. Thereafter, layers of contacts and metal interconnections are formed, if necessary. After this, a passivation film is formed and a pad contact is formed, which completes the DRAM.

The first embodiment is characterized by forming the SN electrode into a normally tapered shape. As shown in FIGS. 12A and 12B and FIGS. 13A and 13B, if the angle θ1 of the lower side faces of the TEOS film 22 and SiN film 21 is a right angle (θ1>90°) or an obtuse angle (θ1>90°), the angle θ2 of the upper corners of the SN electrode 24 is a right angle (θ2=90°) or an acute angle (θ2>90°). As a result, an electric field concentrates at the upper corners of the SN electrode 24.

As described above, the first embodiment produces the following various effects.

Because the outer circumference of the bottom of the SN electrode is made longer, the area of the side faces of the SN electrode is increased. This increases the storage capacity (Cs), enabling the DRAM to operate stably. The coverage of the capacitor insulating film, such as a high dielectric constant film, is improved. This enables the capacitor insulating film to be made thinner, which further increases the storage capacity.

The SN electrode is formed by embedding an electrode film in a trench made in an insulating film, not by processing an electrode film by RIE techniques. Therefore, the side faces of the SN electrode are made flat and smooth, which decreases leakage current in the capacitor insulating film.

Furthermore, because the angle of the top corners of the SN electrode is made greater than 90°, the concentration of electric field is alleviated, which reduces leakage current in the capacitor insulating film.

(Second Embodiment)

Figure 14A:
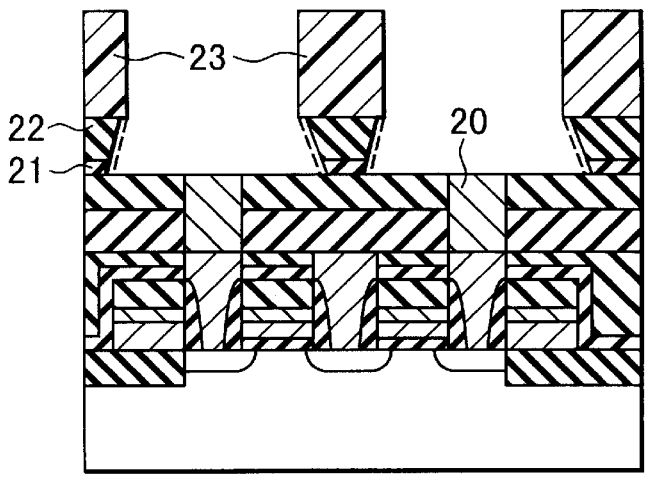
FIGS. 14A and 14B show the main part of the manufacturing processes according to a second embodiment of the present invention.
Figure 14B:
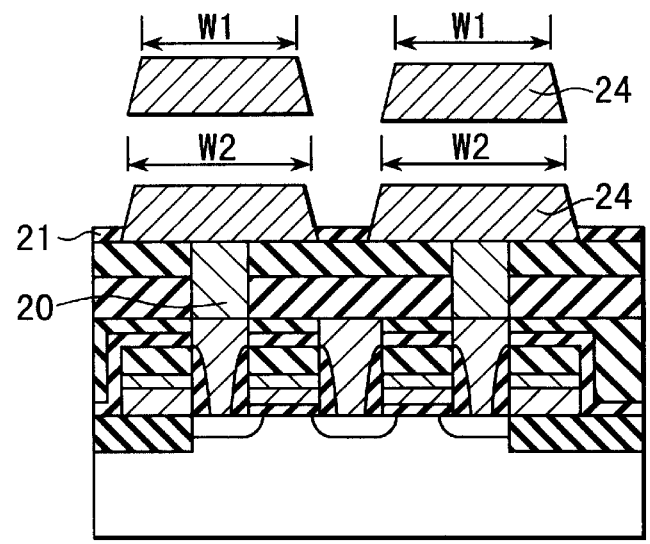

FIGS. 14A and 14B schematically show the structure of a memory cell section in a stacked DRAM according to a second embodiment of the present invention. FIGS. 14A and 14B correspond to FIGS. 6C and 8C of the first embodiment, respectively. The second embodiment differs from the first embodiment in the structure of the SN electrode.

In the second embodiment, the TEOS film 22 and SiN film 21 are etched isotropically by CDE techniques or wet etching techniques after the processes of FIGS. 6A to 6E in the first embodiment. The isotropic etching allows a hole pattern to expand sideways, increasing the surface area of the SN electrode 24. For example, the diameter of the hole pattern is W1 (e.g., 0.2 $\mu$m) in the first embodiment, whereas, in the second embodiment, it is increased to W2 (e.g., 0.3 $\mu$m). This makes it possible to form the SN electrode of the larger size than that determined by lithography. Consequently, the storage capacity of the capacitor can be increased.

(Third Embodiment)

Figure 15A:
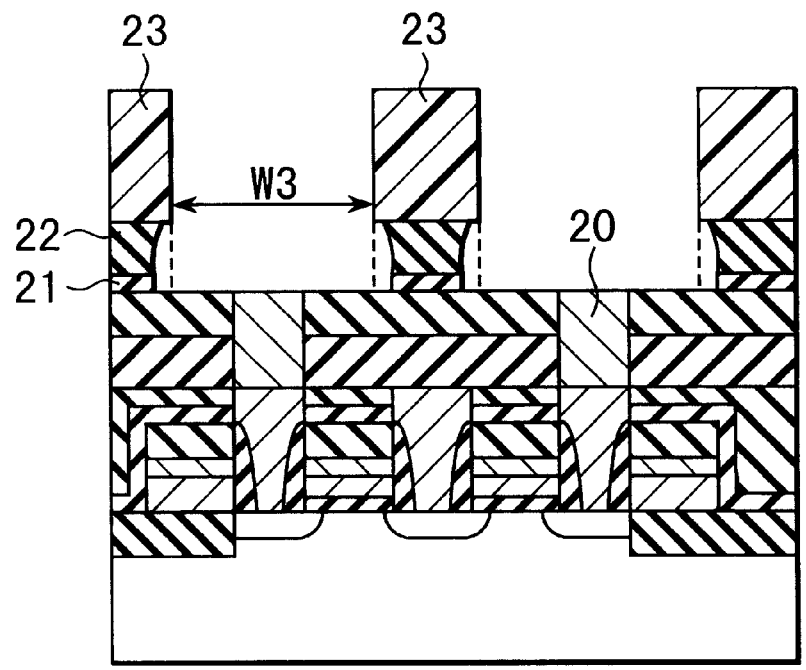
FIGS. 15A and 15B show the main part of the manufacturing processes according to a third embodiment of the present invention.
Figure 15B:
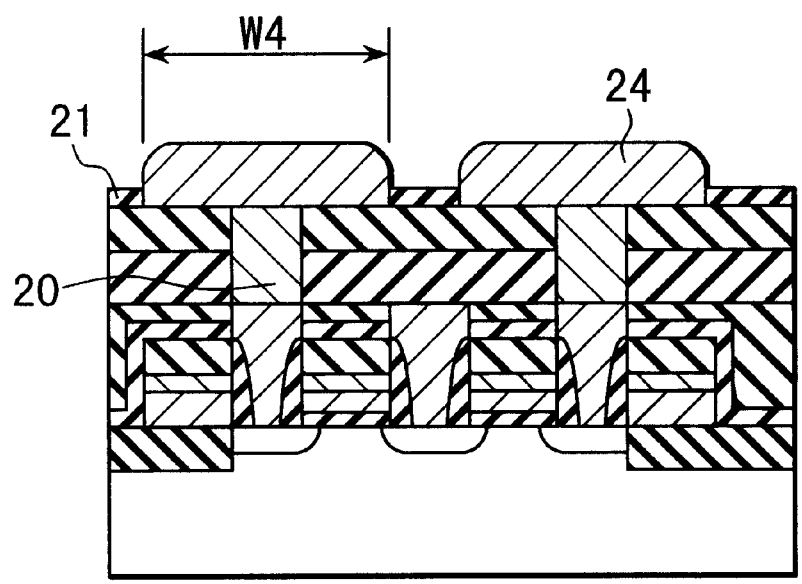

FIGS. 15A and 15B schematically show the structure of a memory cell section in a stacked DRAM according to a third embodiment of the present invention. FIGS. 15A and 15B correspond to FIGS. 6C and 8C of the first embodiment, respectively. The third embodiment differs from the first embodiment in the structure of the SN electrode.

In the third embodiment, the side faces of the TEOS film 22 and SiN film 21 describe a parabola in such a manner that they have a reverse tapered shape. The parabolic etching is realized by a combination of RIE techniques and CDE techniques. Wet etching may be further added to the combination.

In the third embodiment, the parabolic side faces of the SN electrode 24 increase the surface area of the SN electrode. For example, the diameter of the hole pattern can be increased from W3 (e.g., 0.2 $\mu$m) to W4 (e.g., 0.3 $\mu$m). Because the side faces of the SN electrode are parabolic, the surface area of the SN electrode is larger than that in the second embodiment. This makes it possible to form the SN electrode of the size greater than that determined by lithography, increasing the storage capacity. The gentle top corners of the SN electrode suppress an increase in the leakage current caused by the concentration of electric field.

(Fourth Embodiment)

Figure 16A:
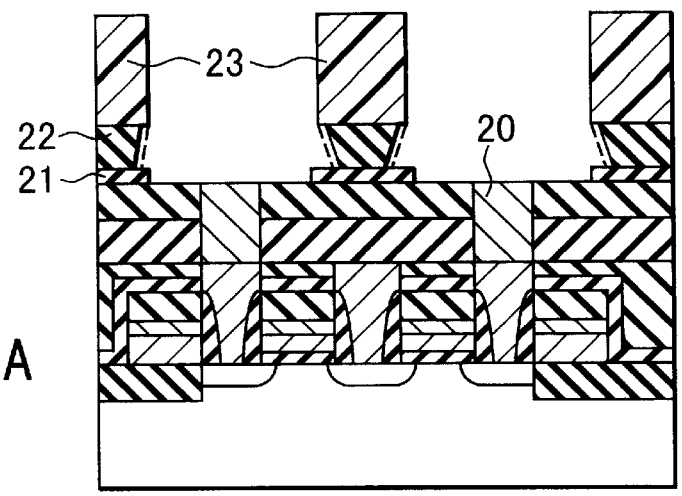
FIGS. 16A to 16C show the main part of the manufacturing processes according to a fourth embodiment of the present invention.
Figure 16B:
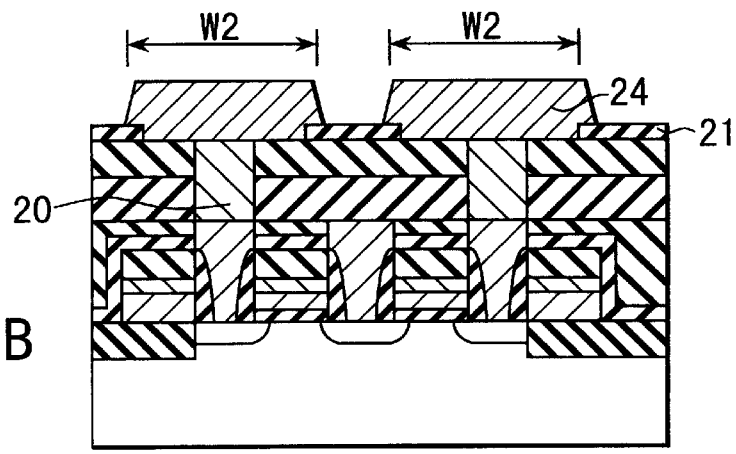
Figure 16C:
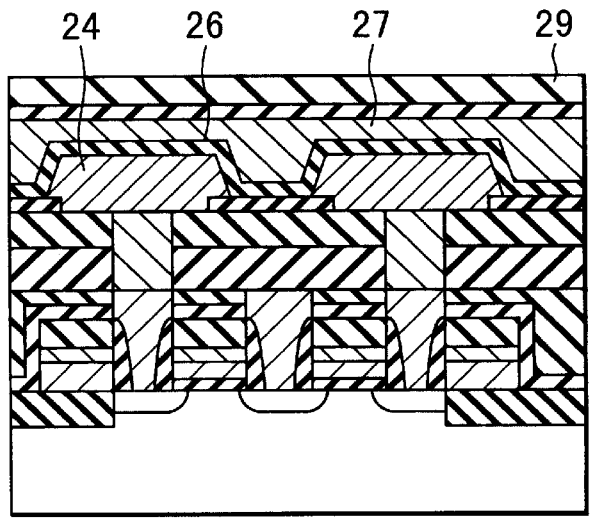

FIGS. 16A, 16B, and 16C illustrate the main processes of manufacturing a memory cell section in a stacked DRAM according to a fourth embodiment of the present invention. FIGS. 16A, 16B, and 16C correspond to FIGS. 6C, 8C, and 11 of the first embodiment, respectively. The fourth embodiment differs from each of the first to third embodiments in the structure of the silicon nitride film 21.

In the second embodiment, after the TEOS film 22 and SiN film 21 have been processed in the processes of FIGS. 6A to 6E, both the TEOS film 22 and the SiN film 21 are etched to enlarge the area of the SN electrode 24. Actually, however, it is difficult to etch the insulating film 22 of an oxide film and the insulating film 21 of a nitride film simultaneously from the viewpoint of control.

In the fourth embodiment, to avoid this problem, only the TEOS film 22 is etched by a desired amount by wet etching techniques using a diluted HF solution or CDE techniques.

The fourth embodiment produces a similar effect to that in the second embodiment in terms of the enlargement of the SN electrode 24. This makes it possible to form the SN electrode of the size greater than that determined by lithography, increasing the storage capacity. The side faces of the SN electrode are recessed near the bottom and the silicon nitride film 21 is in contact with the recessed portions. That is, the silicon nitride film 21 is so formed that it eats into the bottom surface of the SN electrode 24. This improves the adhesion of the SN electrode to the underlying region.

Figure 17A:
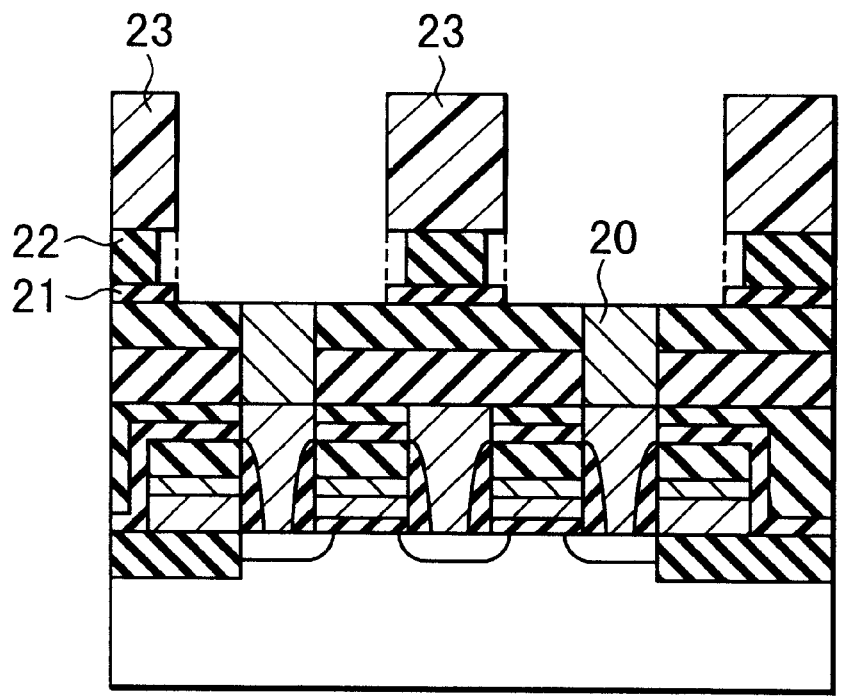
FIGS. 17A and 17B show the main part of the manufacturing processes in a modification of the fourth embodiment.
Figure 17B:
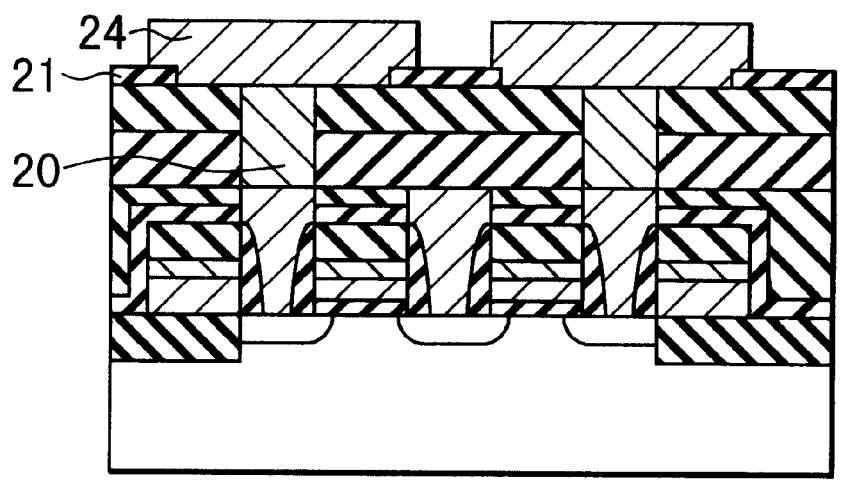

While the side faces of the SN electrode are tapered normally in FIGS. 16A to 16C, they may be formed as shown in FIGS. 17A and 17B. The structure is formed as follows. First, the side faces of the TEOS film 22 and SiN film 21 are processed to the extent that they do not take the form of a taper. Thereafter, only the TEOS film 22 is recessed by a desired amount (e.g., 0.05 $\mu$m) by wet etching techniques using a diluted HF solution or CDE techniques. Since the amount of etching can be controlled exactly by wet etching techniques, the amount of recession of the TEOS film 22 can be controlled precisely.

In each of the above embodiments, a TiN film, a TiSiN film, a TiAlN film, or a TaSiN film may be formed as a barrier metal layer between the W plug 20 and SN electrode 24. Furthermore, an Ru film, an Ir film, an Nb film, or a Ti film may be used as a barrier metal layer. Moreover, a silicide film of these meals may be formed. In addition, a nitride film of the plug film (e.g., the WN film) may be used. Additionally, an Ru film or an Ir film may be used as a barrier metal layer. Furthermore, a conductive oxide film of Ru or Ir may be used. The barrier metal layer is so formed that it is embedded in a trench in which a plug has been formed.

(Fifth Embodiment)

FIGS. 18A to 18C to FIGS. 23A to 23C illustrate processes of manufacturing stacked DRAMs according to a fifth embodiment of the present invention. The first half of the processes in the fifth embodiment are the same as those in FIGS. 5A to 5E of the first embodiment. Therefore, the second half of the processes in the fifth embodiment will be explained. FIGS. 18A to 23A are plan views of a memory cell section, FIGS. 18B to 23B are sectional views taken along line 18B—18B to line 23B—23B of FIGS. 18A to 23A, respectively, and FIGS. 18C to 23C are sectional views taken along line 18C—18C to line 23C—23C of FIGS. 18A to 23A, respectively.

A stacked DRAM of the fifth embodiment is characterized by the connecting structure between the SN electrode and the metal plug. In the fifth embodiment, a conducting, oxidation-resistant barrier metal layer has been formed in such a manner that it self-aligns with the top surface of the metal plug. The SN electrode is electrically connected to the metal plug layer via the barrier metal layer.

A case where n-channel MOS transistors are used for memory cells will be explained. The explanation applies to a case where p-channel MOS transistors are used for memory cells.

Figure 18A:
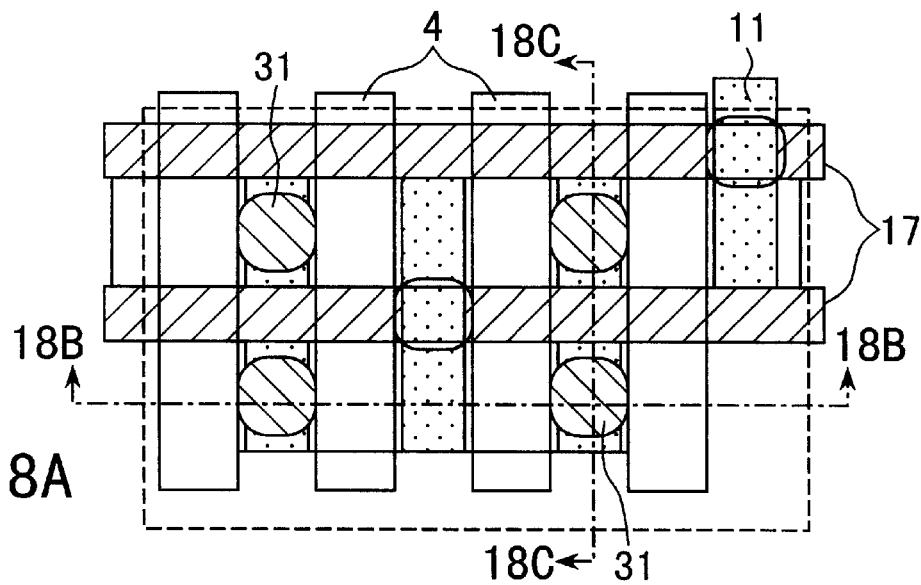
FIGS. 18A to 18C are plan views and sectional views showing part of the manufacturing processes according to a fifth embodiment of the present invention.
Figure 18B:
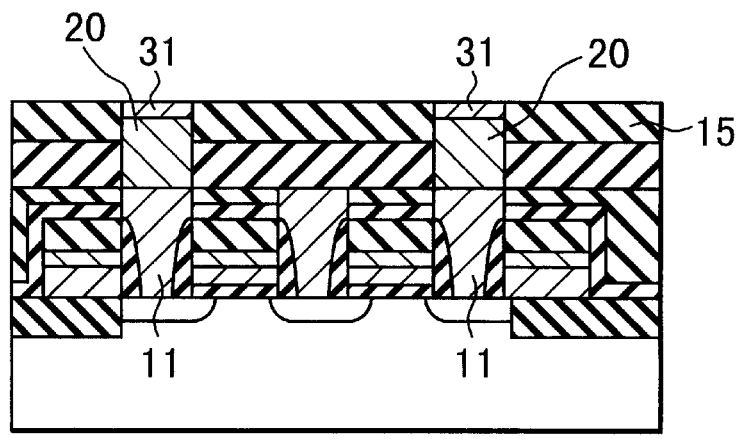
Figure 18C:
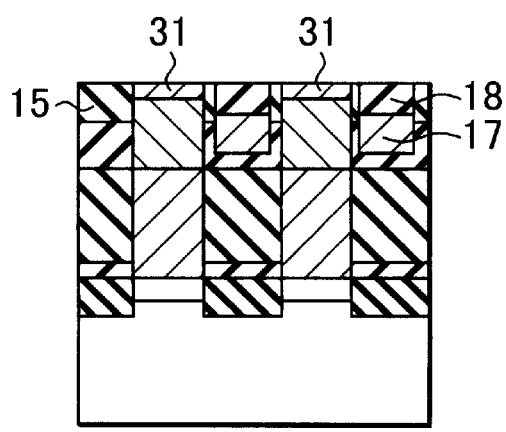

After the processes in FIGS. 5A to 5E in the first embodiment, a WN (tungsten nitride) film is formed to a thickness of about 5 nm to 10 nm as a barrier metal layer 31 on the exposed surface of the W plug 20 in the interlayer insulating film 15 and SiN film 18 as shown in FIGS. 18A to 18C. The barrier metal layer 31 is formed by nitriding the exposed surface of the W plug 20 in an atmosphere of plasma using ammonium gas at a processing temperature of 500° C. using, for example, an RTA unit.

The barrier metal layer 31 may be formed as follows. The exposed surface of the W plug 20 is etched about 10 nm by RIE techniques or CDE techniques to form a recess. Thereafter, an oxidation-resistant film that is not oxidized even in an atmosphere of oxygen at about 500° C. is deposited. Such an oxidation-resistant film is, for example, a TiN (titanium nitride) film, a TiAlN (titanium aluminum nitride) film, a TiSiN (titanium silicon nitride) film, or a TaSiN (tantalum silicon nitride) film. Instead of forming the oxidation-resistant film, such a metal film as an Ir film or an Ru film whose oxide is conductive (RuO$_2$ film is conductive) may be deposited. Thereafter, using CMP techniques, RIE techniques, or CDE techniques, the unnecessary conducting film (the oxidation-resistant film, Ir film or Ru film) is removed to leave the conducting film only on the W plug surface exposed in the recess. The barrier metal layer 31 is formed by the left conducting film.

Figure 19A:
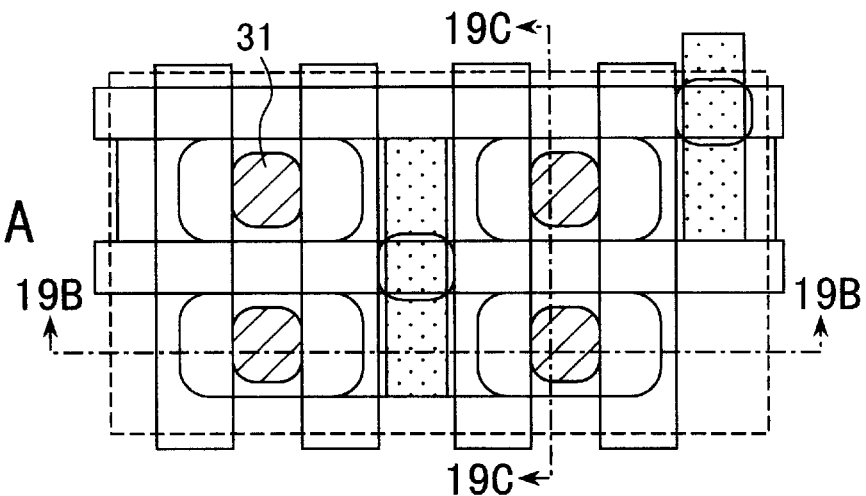
FIGS. 19A to 19C are plan views and sectional views showing part of the manufacturing processes according to the fifth embodiment.
Figure 19B:
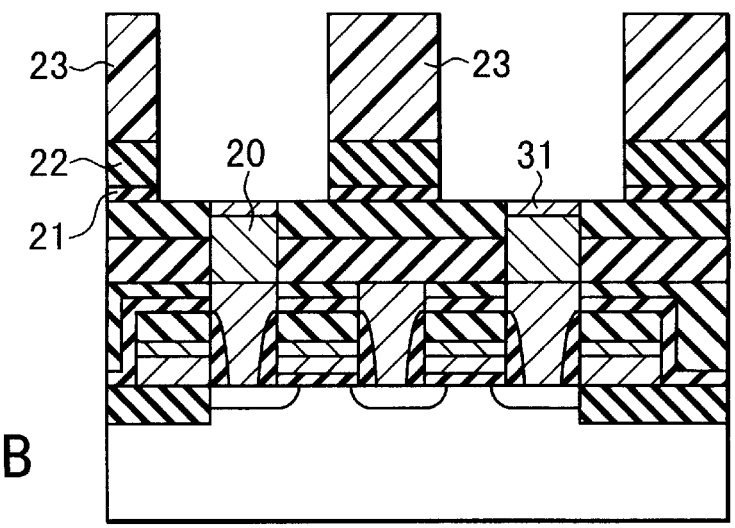
Figure 19C:
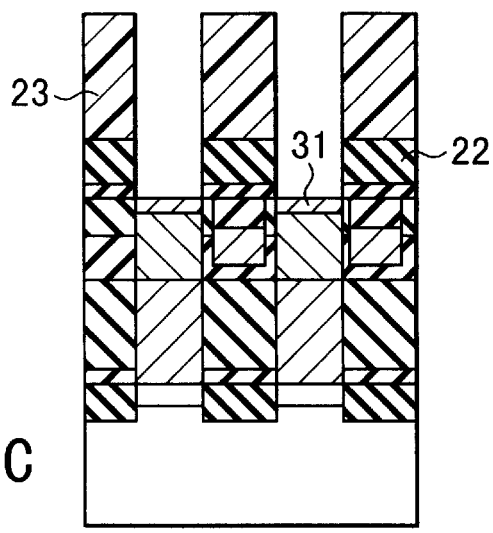

Next, as shown in FIGS. 19A to 19C, a silicon nitride film 21 is deposited to a thickness of about 20 nm on the whole surface. Furthermore, on the silicon nitride film 21, an TEOS oxide film 22 is deposited to a thickness of about 300 nm. Next, a resist whose SN electrode forming area has an opening pattern is formed. With the resist 23 as a mask, the TEOS film 22 and silicon nitride film 21 are etched by RIE techniques to expose the surface of the barrier metal layer 31.

In the etching process, the TEOS oxide film 22 may be etched by RIE techniques using the SiN film 21 as a stopper and thereafter the SiN film 21 may be selectively etched. At this time, if the regions including the peripheral circuit section are covered with the resist 23, they will not be etched.

Figure 20A:
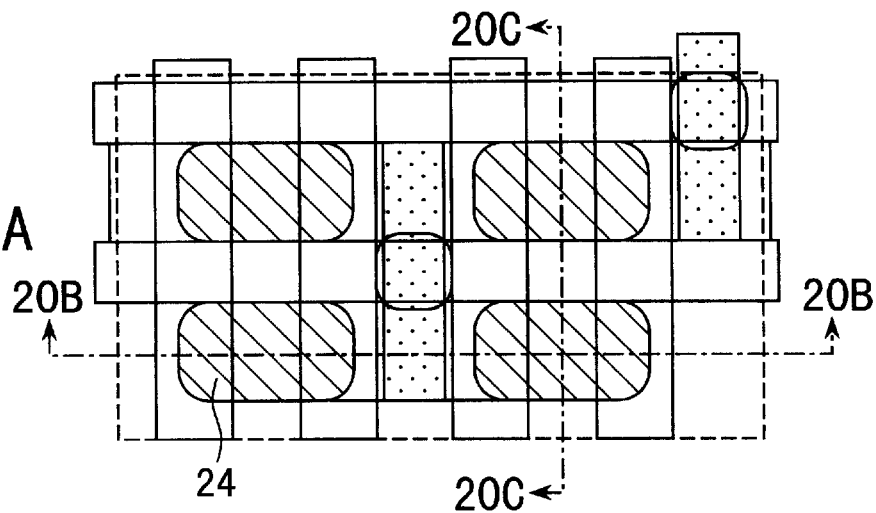
FIGS. 20A to 20C are plan views and sectional views showing part of the manufacturing processes according to the fifth embodiment.
Figure 20B:
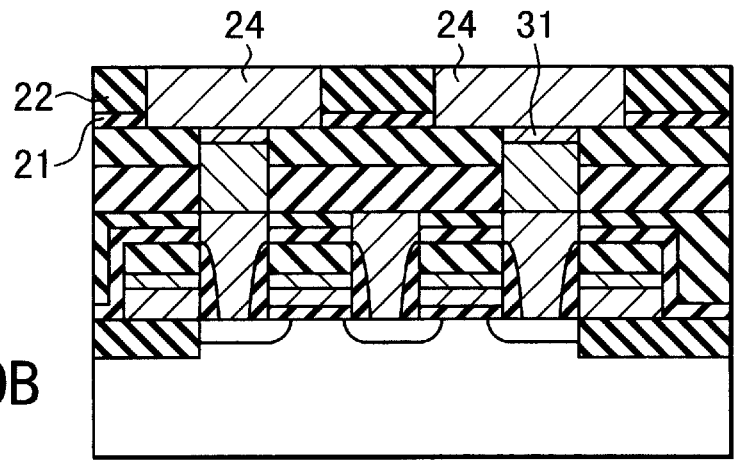
Figure 20C:
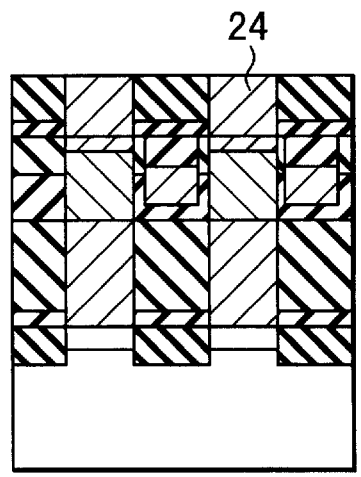

Next, as shown in FIGS. 20A to 20C, an Ru film or an $RuO_2$ film (or a stacked film of these films) is deposited as an SN electrode material to a thickness of about 400 nm on the whole surface by sputtering techniques or CVD techniques. Thereafter, a flattening process is carried out by, for example, CMP techniques or etch back techniques to form an SN electrode 24.

In addition to the above SN electrode materials, a Pt film, an Re film, an Os film, a Pd film, an Rh film, an Au film, an Ir film, or an $IrO_2$ film may be used. Moreover, a metal oxide film (e.g., SRO($SrRuO_3$)) with a perovskite structure may be used as the SN electrode material. Moreover, a film obtained by stuffing the grain of each of these metal films with another metal film (e.g., Rh or Ir) may be used.

Figure 21A:
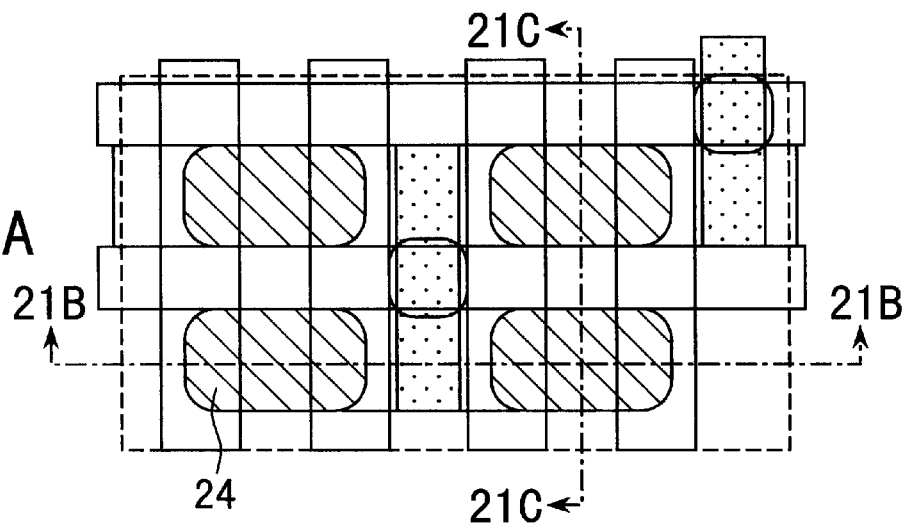
FIGS. 21A to 21C are plan views and sectional views showing part of the manufacturing processes according to the fifth embodiment.
Figure 21B:
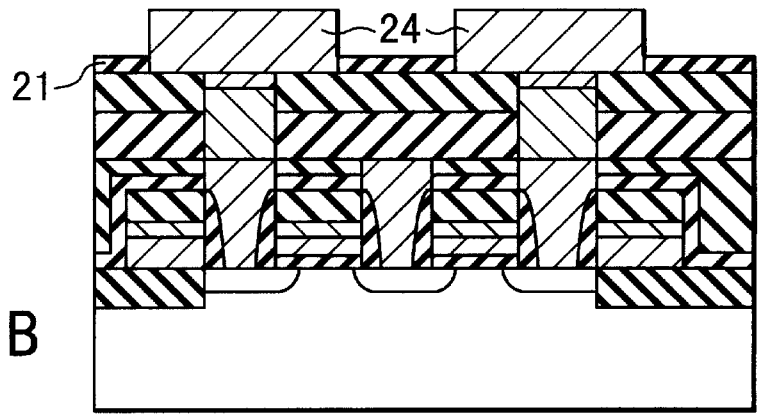
Figure 21C:
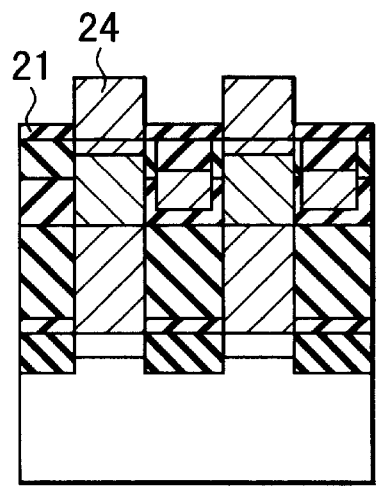

Next, as shown in FIGS. 21A to 21C, the TEOS film 22 is selectively etched using a wet etching solution, such as $NH_4F$ solution. At this time, the SiN film 21 under the TEOS oxide film 22 is used to stop the etching. A region of the TEOS film 22 required not to be removed, such as the peripheral circuit section, is covered with a resist to prevent the region from being etched. By the etching process, the height of the surface of the SN electrode 24 in the memory cell section is made equal to the height of the surface of the TEOS oxide film 22 excluding the memory cell section. Consequently, the step between the memory cell region and the region excluding the memory cell region is eliminated to a negligible level.

The side faces of the SN electrode 24 are the transfer of the side faces of a trench made by etching the TEOS oxide film 22. Because the etching surface of the flat TEOS oxide film 22 is transferred onto the SN electrode, the side faces of the SN electrode can be made flat and smooth. When metal material is etched to form an SN electrode, etching mophology is hard to control and therefore it is difficult to obtain the flat, smooth side faces of the SN electrode. In the fifth embodiment, the side faces of the SN electrode are made flat and smooth, which suppresses the concentration of electric field due to roughness of the side faces of the SN electrode. Consequently, it is possible to suppress an increase in the leakage current in the capacitor insulating film.

Figure 22A:
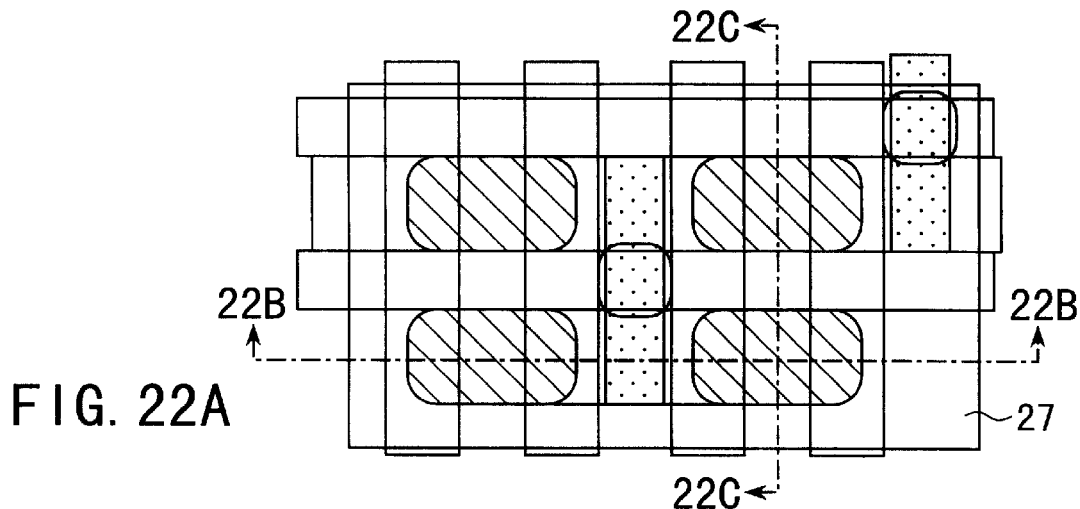
FIGS. 22A to 22C are plan views and sectional views showing part of the manufacturing processes according to the fifth embodiment.
Figure 22B:
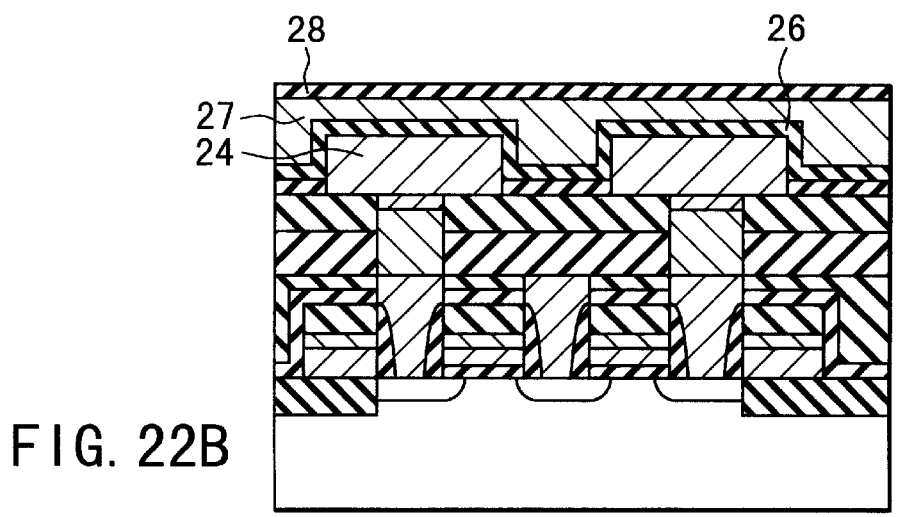
Figure 22C:
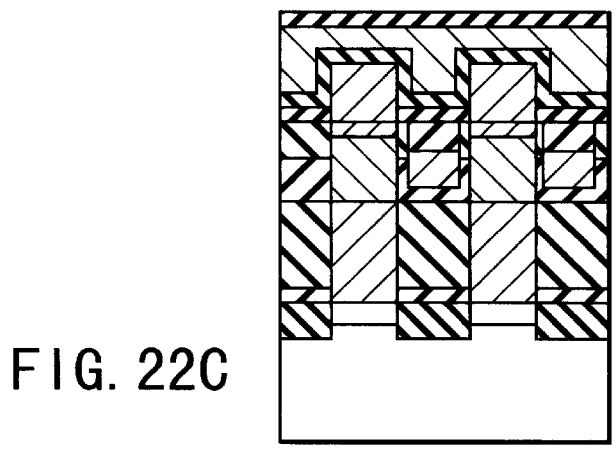

As shown in FIGS. 22A to 22C, a BST film 26 to make a capacitor insulating film is deposited to a thickness of about 20 nm on the whole surface by CVD techniques. Then, on the BTS film 26, an Ru film to make the upper electrode (plate electrode 27) of the capacitor is deposited to a thickness of about 50 nm on the entire surface by CVD techniques. Thereafter, on the Ru film, a TiN film or a W film to make a cap film 28 is formed to a thickness of about 50 nm by sputtering techniques. After this, the plate electrode and cap film 28 are patterned by ordinary lithographic techniques and RIE techniques.

In addition to the Ru film, a noble metal, such as a Pt film, a Re film, an Ir film, an Os film, a Pd film, a Rh film, or an Au film, may be used as the plate electrode 27. Additionally, a metal oxide film of each of these noble metals may be used. Moreover, a metal oxide film with a perovskite structure, such as SRO or CRO, may be used.

Figure 23A:
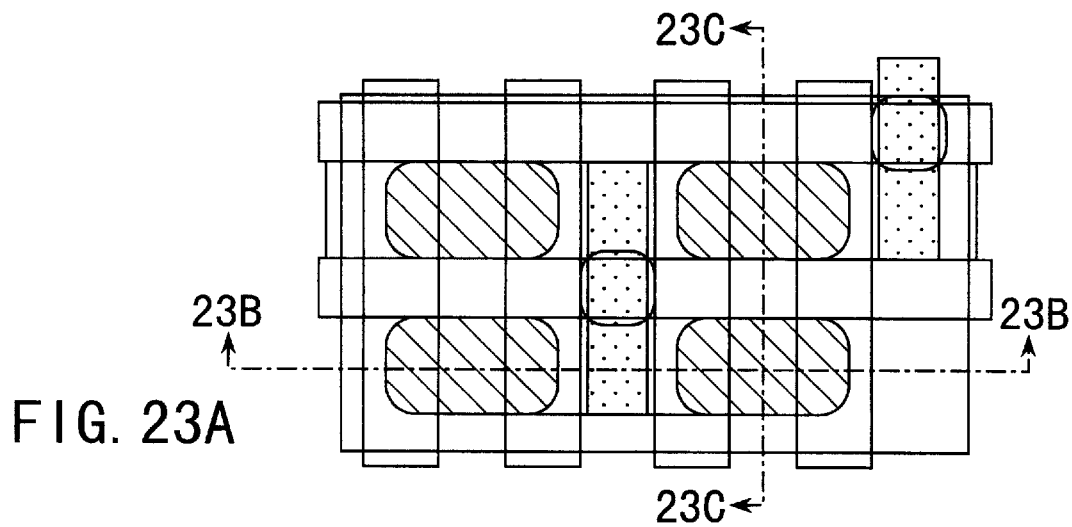
FIGS. 23A to 23C are plan views and sectional views showing part of the manufacturing processes according to the fifth embodiment.
Figure 23B:
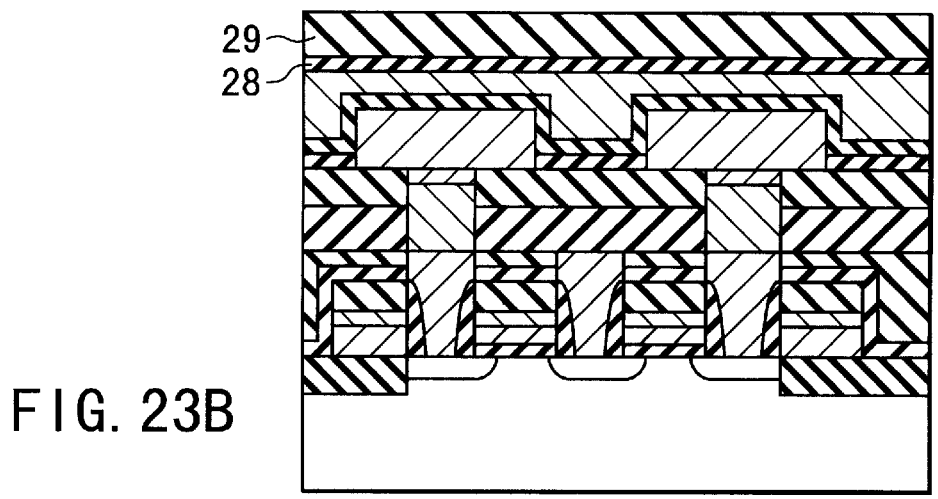
Figure 23C:
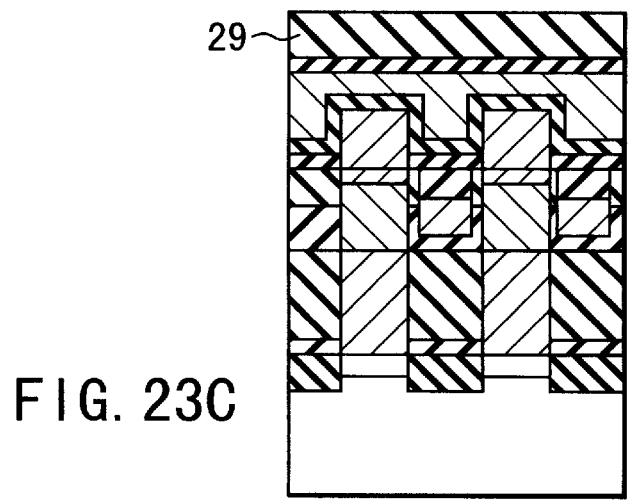

Next, as shown in FIGS. 23A to 23C, an interlayer insulating film 29, such as a plasma TEOS oxide film, is deposited to a thickness of about 400 nm on the whole surface by CVD techniques. Then, the entire surface is flattened by CMP techniques. This eliminates the step between the memory cell section and the peripheral circuit section.

Next, a contact hole is made in a desired region and a metal interconnection 30 is formed. Thereafter, layers of contacts and metal interconnections are formed, if necessary. After this, a passivation film and then a pad contact are formed, which completes the DRAM.

As described above, in the fifth embodiment, the barrier metal layer is formed on the surface of the metal plug in such a manner that it self-aligns with the metal plug. Use of titanium aluminum nitride (TiAlN) or titanium silicon nitride (TiSiN) excellent in oxidation resistance as the barrier metal layer produces a good effect. Specifically, in the process of forming the BST film in an atmosphere of oxygen at high temperature (about 500° C.), the surface of the metal plug can be prevented from being oxidized. This provides a good electrical connection between the plug and the SN electrode. Moreover, it is possible to make the plug film less liable to come off due to volume expansion resulting from the oxidation of the metal film.

In the fifth embodiment, the SN electrode can be formed under forming conditions using oxygen. Therefore, when metal oxide, such as $RuO_X$, $SrRuO_3$, $IrO_X$, or $CaRuO_3$, helping improve the reliability of the BST film, is used as an SN electrode, more latitude for the film forming conditions is allowed in forming such a metal oxide, improving the yield.

In forming the capacitor insulating films, including BST, the restrictions on oxygen partial pressure and film forming temperature are alleviated. Therefore, the film forming conditions for the BST film and the crystal annealing conditions can be optimized, which improves the characteristics of the BST film.

In the fifth embodiment, when the SN electrode (Ru, $RuO_X$, $SrRuO_3$, $IrO_X$, or $CaRuO_3$) is formed, the underlying $SiO_2$ film is also subjected to the surface processing. As a result, the incubation time in forming the SN electrode film by CVD techniques becomes equal to another, enabling an SN electrode film to be formed uniformly all over the surface.

Furthermore, the barrier metal layer is formed only on the top surface of the metal plug in a self-aligning manner. Especially, by nitriding a plug material to form a barrier metal layer, the processes can be simplified.

(Sixth Embodiment)

Figure 24A:
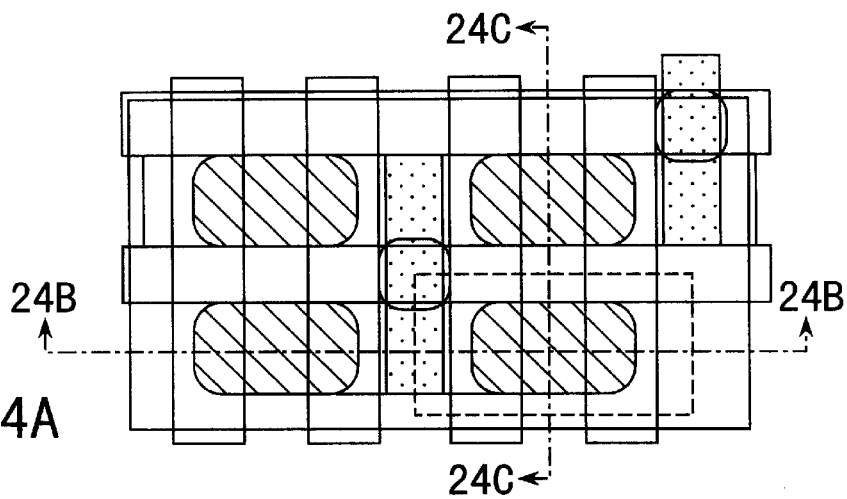
FIGS. 24A to 24C are plan views and sectional views of a sixth embodiment of the present invention.
Figure 24B:
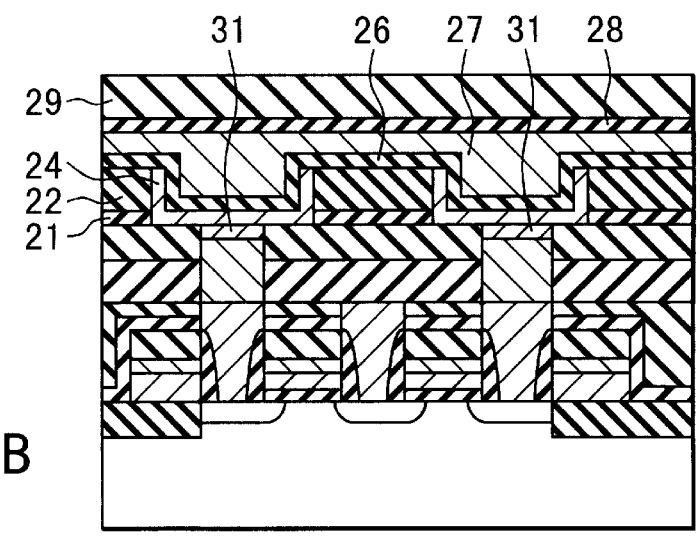
Figure 24C:
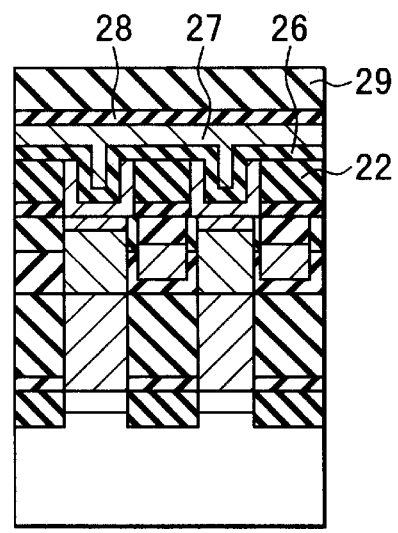

FIGS. 24A to 24C show a schematic structure of a stacked DRAM according to a sixth embodiment of the present invention.

The sixth embodiment differs from the fifth embodiment in the structure of the SN electrode. While in the fifth embodiment, the SN electrode has been formed into a box shape, an SN electrode is formed on the side faces and bottom face of a trench in the sixth embodiment. Hereinafter, the processes of manufacturing such a structure will be explained.

In the process of FIG. 19 in the fifth embodiment, after a trench has been shaped and the resist has been removed, an Ru film or an RuO$_2$ film to make an SN electrode is deposited by sputtering techniques or CVD techniques. The film thickness is set to 30 to 40 nm on the side faces of the trench. Thereafter, with the bottom of the trench covered with an SOG film or a resist so as not to be etched, a flattening process is carried out using CMP techniques or etching techniques. The flattening process enables the SN electrode 24 to be selectively formed on the side faces and bottom face of the trench.

In the sixth embodiment, because the SN electrode is selectively formed on the side faces and bottom face of the trench, the flatness between the memory cell section and the peripheral circuit section can be improved. Furthermore, because a silicon oxide film, such as TEOS, is in contact with the side faces of the SN electrode, the adhesion of the SN electrode is improved.

(Seventh Embodiment)

Figure 25A:
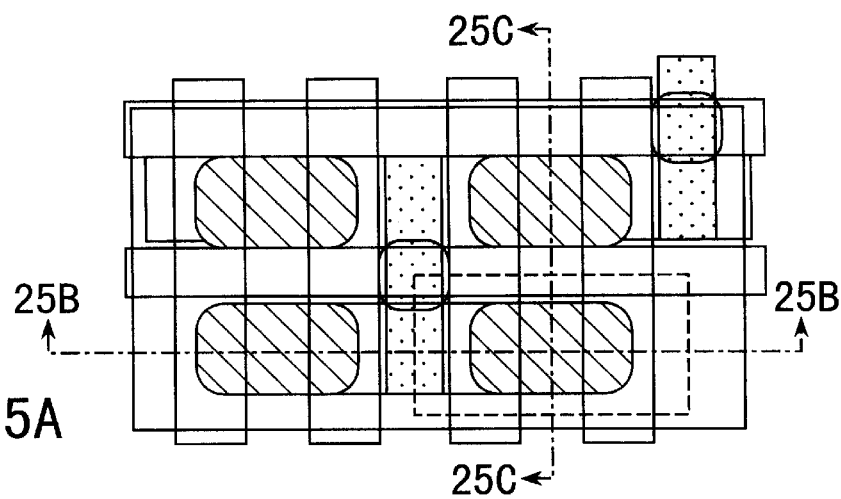
FIGS. 25A to 25C are plan views and sectional views of a seventh embodiment of the present invention.
Figure 25B:
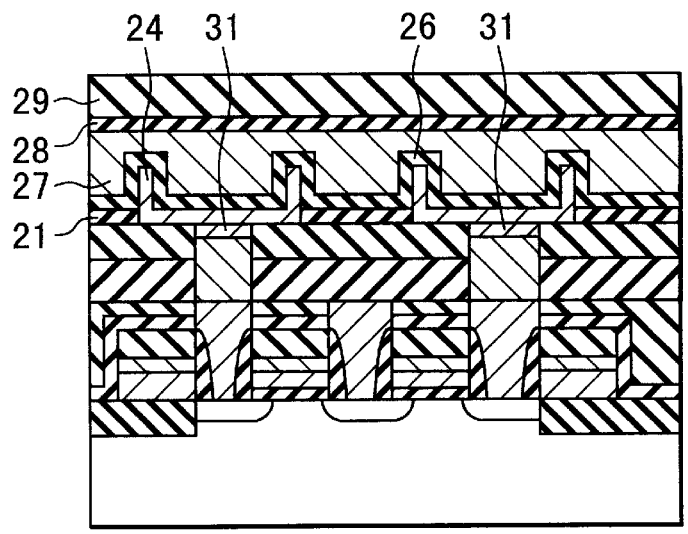
Figure 25C:
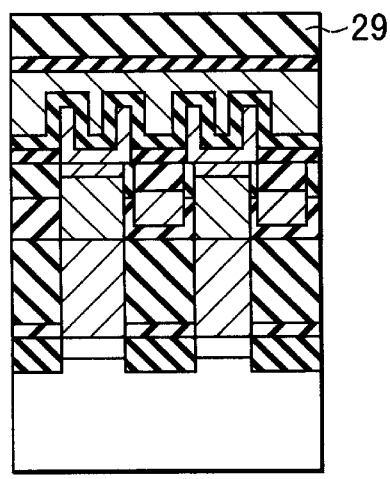

FIGS. 25A to 25C show a schematic structure of a stacked DRAM according to a seventh embodiment of the present invention. The seventh embodiment differs from the fifth embodiment in the structure of the SN electrode.

In the seventh embodiment, after the SN electrode 24 has been formed in the sixth embodiment (FIG. 24), the interlayer insulating film 22 is removed by wet etching using, for example, a diluted hydrofluoric acid solution. The wet etching is stopped at the silicon nitride film 21 and the SN electrode 24 is formed into a cylindrical shape.

In the seventh embodiment, both the inner wall and outer wall of the cylindrical SN electrode are used as a capacitor electrode, which decreases the height of the SN electrode. Although a cylindrical SN electrode has been already proposed, the cylindrical SN electrode of the seventh embodiment is characterized by using a material for the barrier metal layer 31 that has a good adhesion to the material for the SN electrode 24.

While in the fifth, sixth, and seventh embodiments, the BST film has been used as the capacitor insulating film, any high-permittivity insulating film may be used. For example, a PZT film, an STO (SrTiO$_3$) film, a BTO (BaTiO$_3$) film or a Ta$_2$O$_5$ film may be used.

(Eighth Embodiment)

FIGS. 26A to 26H illustrate the processes of manufacturing a stacked DRAM according to an eighth embodiment of the present invention.

Figure 26A:
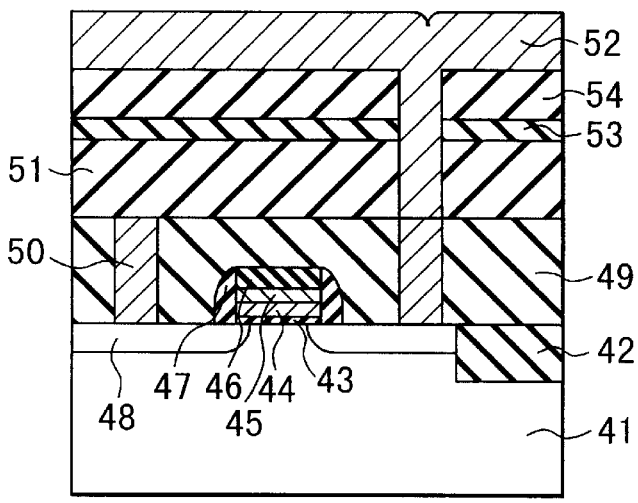
FIGS. 26A to 26H show manufacturing processes according to an eighth embodiment of the present invention.

First, as shown in FIG. 26A, a (100) oriented p-type silicon substrate 41 (or n-type silicon substrate) with an impurity concentration of about $5 \times 10^{15}$ cm$^{-3}$ is prepared. Then, a p-well is formed in an n-channel transistor region and an n-well is formed in a p-channel transistor region (not shown). Thereafter, a trench is made in the silicon substrate 41 by RIE techniques. By embedding an insulating film in the trench, an STI region 42 (with a trench depth of about 0.2 μm) is formed.

Next, a silicon oxide film with a thickness of about 60 nm is formed as a gate insulating film 43 for a transistor. On the gate insulating film 43, a conducting film to make a gate electrode is formed. The conducting film makes a word line in a memory cell section. In the eighth embodiment, to reduce the resistance, the gate electrode has a polycide structure (e.g., a stacked structure composed of a multilayer film of a polycrystalline silicon film 44 and a WSi$_2$ film 45, the thickness of each of the polycrystalline silicon film 44 and WSi$_2$ film 45 being about 50 nm). Only a polycrystalline silicon film may be used for the gate electrode structure. Alternatively, a stacked structure consisting of a polycrystalline silicon film and a W film may be used as the gate electrode structure.

The gate electrode is processed as followed. First, a silicon nitride film (Si$_3$N$_4$ film) is formed as a gate cap film 46 on a conducting film to make a gate electrode. The gate cap film 46 will act as an etching stopper for the gate electrode in a later process. Thereafter, a resist pattern (not shown) is formed on the gate cap film 46. Then, with the resist pattern as a mask, the gate cap film 46 is processed. Thereafter, using the processed gate cap film 46 as a mask, the gate electrode is processed.

Next, high-speed thermal oxidation is effected for about 100 seconds in an atmosphere of oxygen at 1050° C. by RTO (Rapid Thermal Oxidation) techniques to form what is called a post-oxidation film (not shown). This process is carried out to improve the breakdown voltage between the gate electrode and an impurity diffused layer (formed in a later process). Then, with a resist pattern (not shown), gate electrodes 45 and gate cap film 46 as a mask, an n$^-$ impurity diffused layer 48 acting as the source/drain is formed by ion implantation.

Next, a silicon nitride film 47 (with a thickness of, for example, about 20 nm) is deposited on the whole surface by LP-CVD techniques. Then, a sidewall film made of the silicon nitride film 47 is formed on the sidewalls of the gate electrode by RIE techniques. Thereafter, a silicon nitride film (with a thickness of, for example, about 20 nm) (not shown) is formed on the whole surface by LP-CVD techniques. Additionally, a BPSG film is deposited as an interlayer insulating film 49 to a thickness of about 500 nm on the whole surface by CVD techniques. Thereafter, by CMP (Chemical Mechanical Polish) techniques, the interlayer insulating film 49 is polished flat. The polishing is so done that the interlayer insulating film 49 on the gate cap film 46 has a thickness of about 100 nm. By the CMP process, almost all the surface of the substrate is made flat.

Besides the n$^-$-type diffused layer 48, an n$^+$-type diffused layer may be formed as the source/drain. Specifically, after a sidewall film 47 has been formed, ions are implanted into the silicon substrate using the resist, sidewall film, and gate electrode as a mask to form an n$^+$-type source/drain diffused layer.

Next, a resist (not shown) is applied to the surface of the interlayer insulating film 49. With the resist as a mask, etching is done to make a contact hole for connecting the impurity diffused layer 48 to the bit line and the SN electrode.

In etching the contact hole, high selective ratio RIE techniques are used which achieves an etching rate of about 10 or more between the BPSG film used for the interlayer insulating film 49 and the silicon nitride film to make a stopper film (that is, the etching speed of the BPSG film is set more than ten times as fast as that of the silicon nitride film). Use of such etching techniques prevents a short circuit between the gate electrode 45 and an n$^+$-type polycrystalline silicon film embedded in the contact hole in a later process.

Next, an n$^+$-type polycrystalline silicon film into which impurities, such as phosphorus (P$^+$) or arsenic (As$^+$), have been doped is deposited on the whole surface by LP-CVD techniques. Then, by CMP or etch-back techniques, the n$^+$-type polycrystalline silicon film is left only in the contact hole to form a polycrystalline silicon plug 50. The polycrystalline silicon plug 50 is electrically connected to the source/drain diffused layer to make an SN contact and a BL contact.

Next, an interlayer insulating film 51 is deposited to a thickness of about 100 nm on the whole surface. Then, using ordinary lithographic techniques and RIE techniques, a contact hole and a trench are made in the interlayer insulating film 51. By embedding conductive material in the contact hole and trench, a bit-line contact and a bit line (not shown) are formed. This electrically connects the polycrystalline silicon plug (BL contact) to the bit line. This process shows an example where what is called a dual damascene process is used to embed a W film in the trench and others.

Thereafter, a silicon nitride film 53 is deposited as an etching stopper film to a thickness of about 50 nm on the whole surface. After the etching stopper film has been flattened, an interlayer insulating film made of a TEOS film 54 is deposited to a thickness of about 150 nm. The interlayer insulating film 54 may be made of any material (e.g., a BPSG film or an SOG film) other than the TEOS film, as long as the material can be selectively wet-etched with reference to the silicon nitride film 53 serving as an etching stopper film.

Next, the interlayer insulating film 54, etching stopper film 53, and interlayer insulating film 51 are etched by RIE techniques to make a contact hole reaching the polycrystalline silicon plug 50. Thereafter, a tungsten film 52 is deposited on the whole surface by CVD techniques. Although the W film has been used, an Ru film or an Ir film may be used.

Figure 26B:
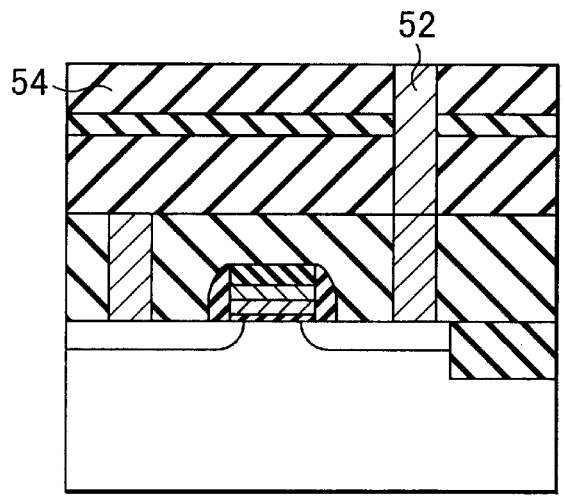

Then, as shown in FIG. 26B, the tungsten film on the interlayer insulating film 54 is removed by CMP techniques in such a manner that the tungsten film 52 is left only in the contact hole.

Figure 26C:
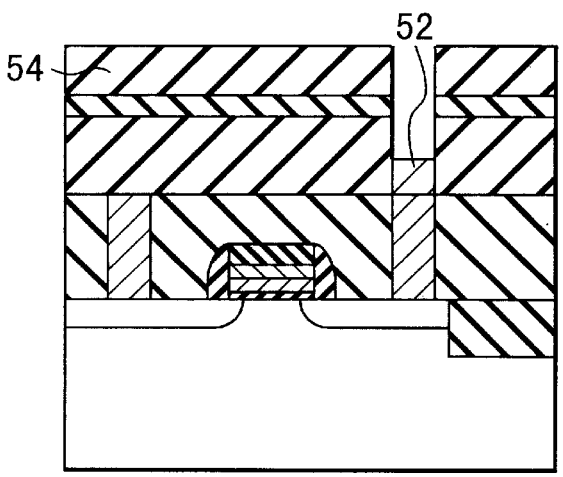

Next, as shown in FIG. 26C, the tungsten film in the contact hole is selectively etched by RIE techniques (recessing process) to form a tungsten plug 52.

Figure 26D:
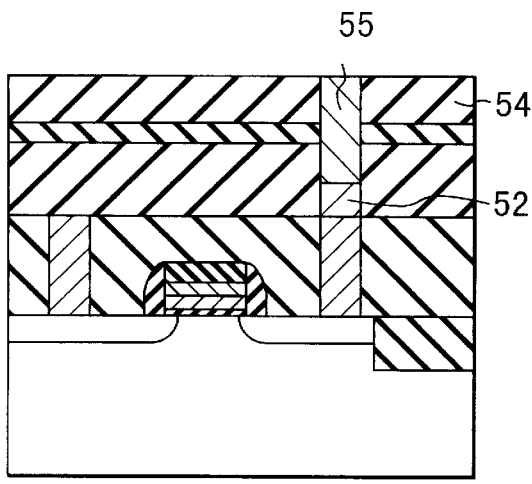

Then, as shown in FIG. 26D, a ruthenium (Ru) film 55 is deposited on the whole surface by CVD techniques. Instead of CVD techniques, sputtering techniques or plating techniques may be used. Thereafter, the ruthenium film on the interlayer insulating film 54 is removed by CMP techniques in such a manner that part of the ruthenium film is left only in the upper part of the contract hole, thereby forming a first SN electrode 55.

Figure 26G:
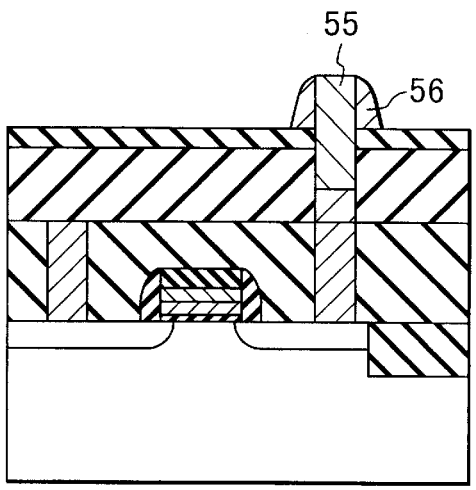
Figure 26E:
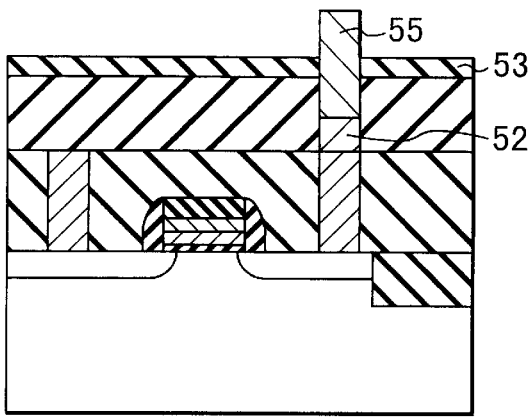

Next, as shown in FIG. 26E, the interlayer insulating film 54 on the etching stopper film 53 is selectively etched by solution, such as $NH_4F$ solution. At this time, the etching stopper film 53 made of a silicon nitride film functions as a stopper film against wet etching.

Figure 26H:
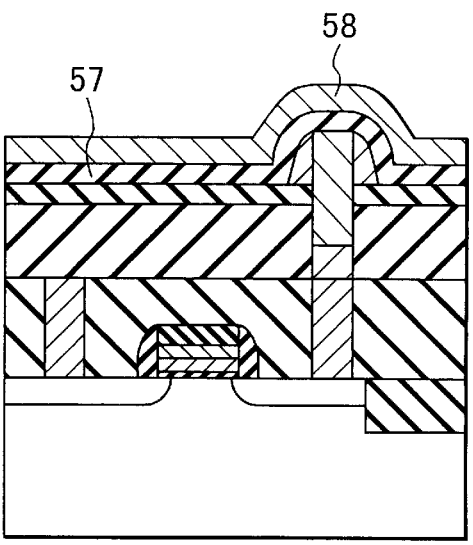
Figure 26F:
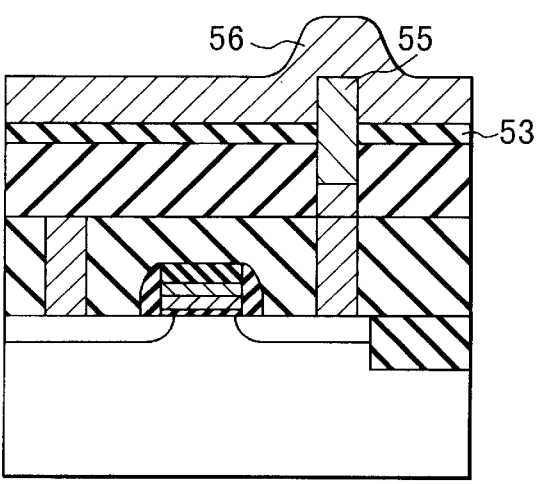

Next, as shown in FIG. 26F, a ruthenium film 56 to make a second SN electrode is deposited on the whole surface by CVD techniques. Instead of CVD techniques, sputtering techniques or plating techniques may be used.

Then, as shown in FIG. 26G, the ruthenium film 56 is etched by RIE techniques in such a manner that the ruthenium film 56 is left only on the sidewalls of the first SN electrode 55, thereby forming a second SN electrode 56 on the sidewalls of the first SN electrode 55.

Next, as shown in FIG. 26H, a (Ba, Sr)$TiO_3$ film (BST film 57) is deposited as a capacitor insulating film to a thickness of about 20 nm on the whole surface by CVD techniques. Then, a ruthenium film is deposited as a plate electrode 58 to a thickness of about 50 nm on the whole surface. Thereafter, the BST film 57 and ruthenium film 58 are processed using RIE techniques.

Instead of the high-permittivity film with a perovskite structure, represented by BST, such a high dielectric constant film as $Ta_2O_5$ may be used. A ferroelectric film, such as (Pb, Zn)$TiO_3$, may be used as the capacitor insulating film 57. In addition, an Si oxide, an aluminum oxide ($Al_2O_3$), or an Si nitride may be used.

By the above processes, a capacitor in the DRAM is made up of the first SN electrode 55, second SN electrode 56, capacitor insulating film 57, and PL electrode 58.

As described above, in the eighth embodiment, photolithographic techniques are not used in processing the SN electrodes 55 and 56 and the first SN electrode 55 is formed in such a manner that it self-aligns with the tungsten plug 52. As a result, the SN electrode is electrically connected to the plug reliably.

Because the SN electrode 55 is formed so as to self-align with the tungsten plug 52, the exposure of the plug material is prevented reliably. As a result, the plug is prevented from being oxidized in forming the capacitor insulating film. Moreover, both the contact of the plug material with the capacitor insulating film and the contact of the plug material with the PL electrode are prevented.

Because photolithographic techniques have not been used in processing the SN electrodes, the number of processes of forming the capacitor is smaller than in the prior art.

Furthermore, because the top corners of the SN electrode are not acute, the concentration of electric field at the top corners is suppressed, which suppresses leakage current in the capacitor insulating film.

As the first and second SN electrodes, a Ti film, a TiN film, a TiAlN film, a W film, a $WN_X$ film, an $SrRuO_3$ film, an Ru film, a Pt film, a Re film, an Ir film, an Os film, a Pd film, an Rh film, or an Au film may be used. An oxide conductor of each of these metals or a conductor containing a small amount of oxygen in each of these metals may be used.

The material for the first SN electrode may be made different from that for the second SN electrode by using those electrode materials. For example, a material that provides a good electrical connection with the plug material may be used as the first SN electrode material and a material that has an excellent adhesion to the etching stopper film may be used as the second SN electrode.

Although the material for the first SN electrode is the same as that for the second SN electrode, the first SN electrode may be made different from the second SN electrode in crystal structure and composition by changing the film forming method or film forming conditions (e.g., temperature or atmosphere).

Figure 27A:
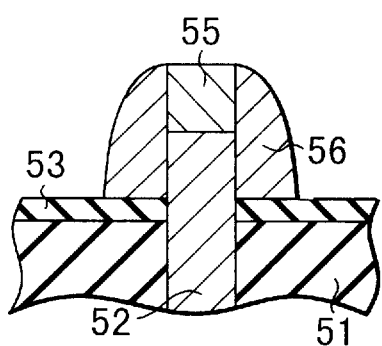
FIGS. 27A and 27B show a modification of the eighth embodiment.
Figure 27B:
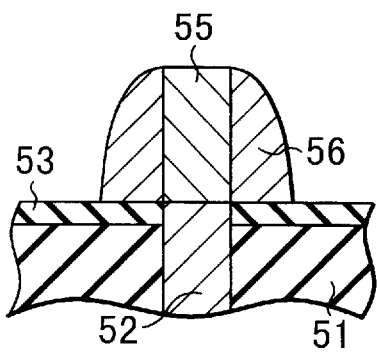

FIGS. 27A and 27B are schematic sectional views of the SN electrode section and its vicinity, showing modifications of the eighth embodiment.

While in the example of FIG. 26, the contact surface between the plug 52 and first SN electrode 55 is located lower than the etching stopper film 53, the contact surface between the plug 52 and first SN electrode 55 has only to be within the contact hole in which the plug 52 has been formed. For example, the contact surface between the plug 52 and first SN electrode 55 may be located higher than the etching stopper film 53 as shown in FIG. 27A. Alternatively, it may be as high as the etching stopper film 53 as shown in FIG. 27B. The position of the contact surface between the plug 52 and first SN electrode 55 can be adjusted by changing the amount of etching in the process of recessing the plug material.

As described above, because there is a latitude in the height of the contact surface between the plug 52 and first SN electrode 55, the process margin can be widened. When expensive material, represented by noble metal material, is used for the first SN electrode 55, use of the structure shown in FIG. 27A decreases the total volume of the first SN electrode.

Figure 28:
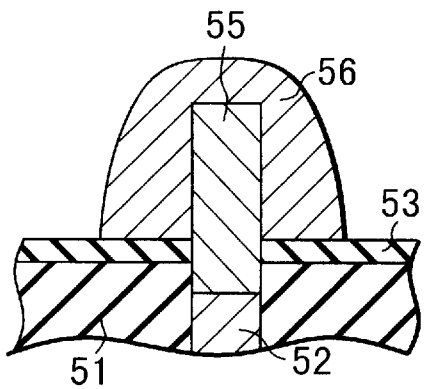
FIG. 28 shows a modification of the eighth embodiment.

Furthermore, as shown in FIG. 28, the second SN electrode 56 may cover the side and top faces of the first SN electrode 55. Such a structure is effective when the oxide of the martial for the first SN electrode 55 is an insulator. In this case, a material for the second SN electrode 56 should be such that the oxide of the material is conductive. Such a structure prevents the first SN electrode from being oxidized in forming a capacitor insulating film, which provide a highly reliable capacitor.

Figure 29:
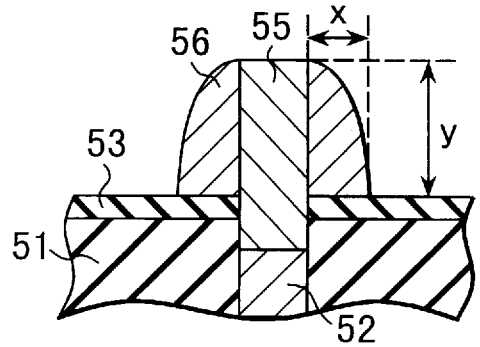
FIG. 29 is a view showing that the area of the storage area of a capacitor can be varied in the eighth embodiment.

Additionally, as shown in FIG. 29, the area of the charge storage region of the capacitor can be changed by changing the width x of the second SN electrode 56 and the distance y from the top surface of the first SN electrode 55 to the etching stopper film 53.

The etching stopper film 53 is not necessarily provided. It may be eliminated to decrease the number of processes.

(Ninth Embodiment)

Figure 30A:
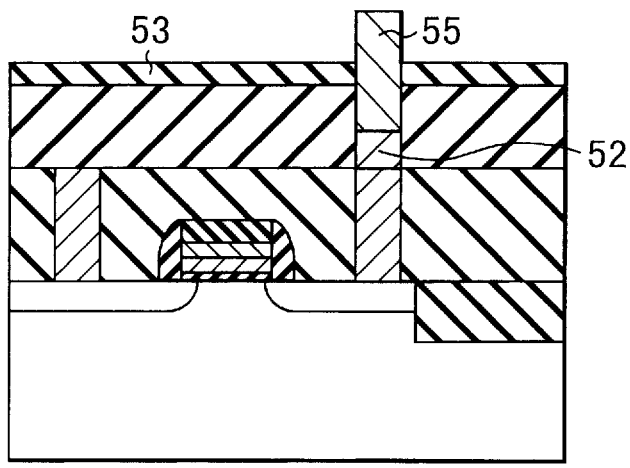
FIGS. 30A to 30D illustrate manufacturing processes according to a ninth embodiment of the present invention.
Figure 30B:
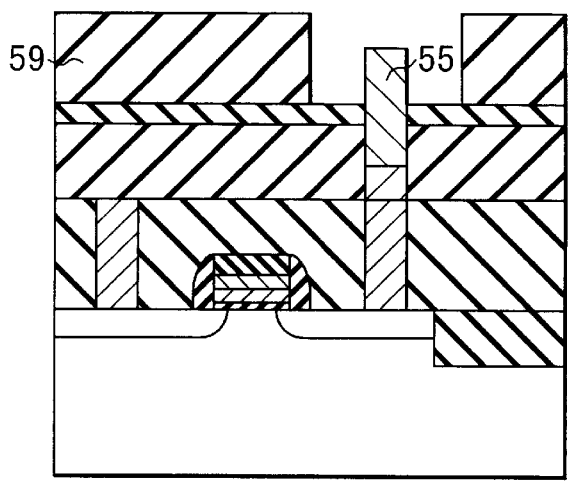

FIGS. 30A and 30B illustrate processes of manufacturing a stacked DRAM according to a ninth embodiment of the present invention. The first half of the processes correspond to the process up to the one in FIG. 26E in the eighth embodiment. FIG. 30A corresponds to FIG. 26E.

After the process of FIG. 30A, a silicon oxide film, such as a TEOS film 59, is deposited on the whole surface by CVD techniques as shown in FIG. 30B. Thereafter, a trench is made in the TEOS film 59 by photolithographic techniques and RIE techniques.

Figure 30C:
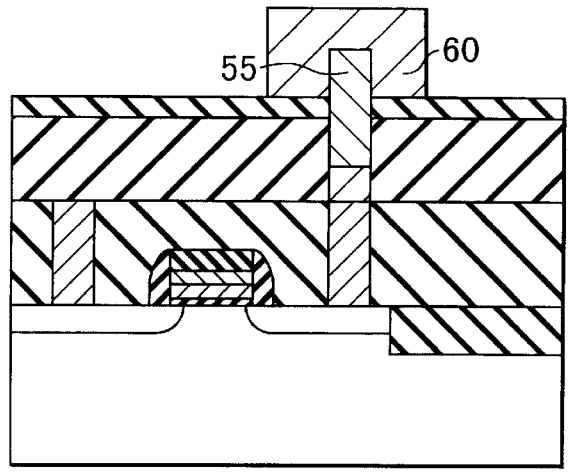

Next, as shown in FIG. 30C, an Ru film is deposited on the whole surface by CVD techniques. Then, using CMP techniques, the Ru film on the TEOS film 59 is removed. Thereafter, the TEOS film 59 is selectively etched using solution, such as $NH_4F$ solution, to form a second SN electrode 60.

Figure 30D:
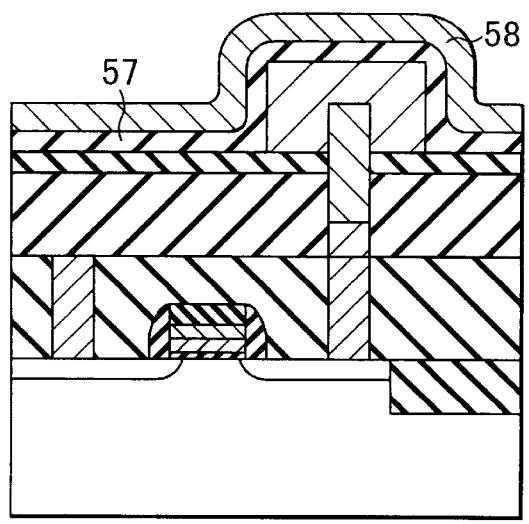

Then, as shown in FIG. 30D, a BST film is deposited as a capacitor insulating film 57 on the whole surface by CVD techniques. On the capacitor insulating film 57, an Ru film is further deposited as a PL electrode 58. Thereafter, these films are processed by RIE techniques to form a capacitor cell.

The ninth embodiment produces a similar effect to that in the eighth embodiment. In addition, the ninth embodiment has the advantage of enabling the second SN electrode to be formed into a desired shape.

(Tenth Embodiment)

FIGS. 31A to 31D illustrate processes of manufacturing a stacked DRAM according to a tenth embodiment of the present invention. The first half of the processes correspond to the processes up to the one in FIG. 26C in the eighth embodiment.

Figure 31A:
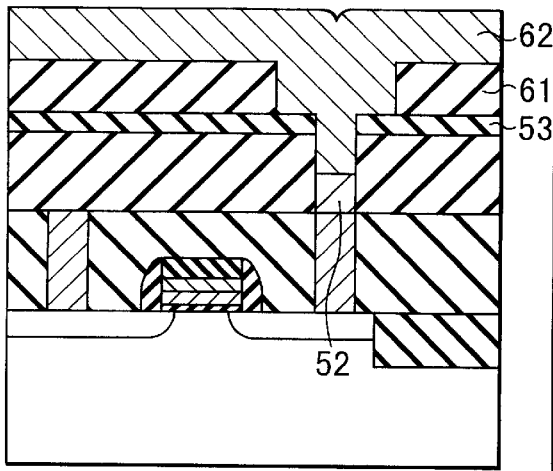
FIGS. 31A to 31D illustrate manufacturing processes according to a tenth embodiment of the present invention.

After the process of FIG. 26C, as shown in FIG. 31A, the TEOS film 61 (corresponding to the TEOS film 54 of FIG. 26C) is processed into a shape corresponding to the second SN electrode, thereby making a trench. Then, an Ru film 62 to make an SN electrode is deposited on the whole surface by CVD techniques.

Figure 31B:
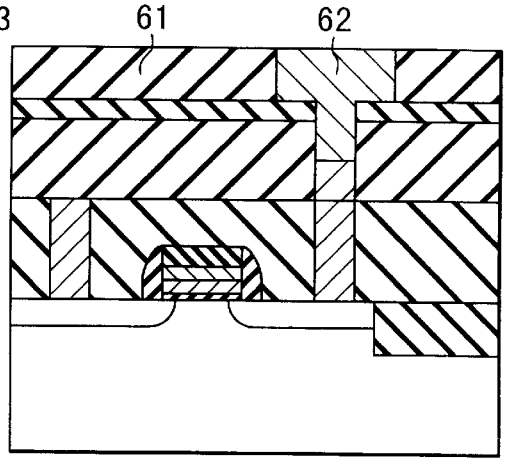

Then, as shown in FIG. 31B, the unnecessary part of the Ru film 62 is removed using CMP techniques, thereby forming an SN electrode.

Figure 31C:
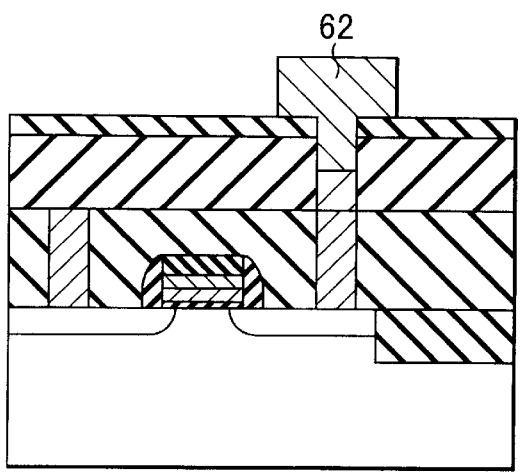

Then, as shown in FIG. 31C, the TEOS film 61 on the etching stopper film 53 is removed using a suitable etching solution.

Figure 31D:
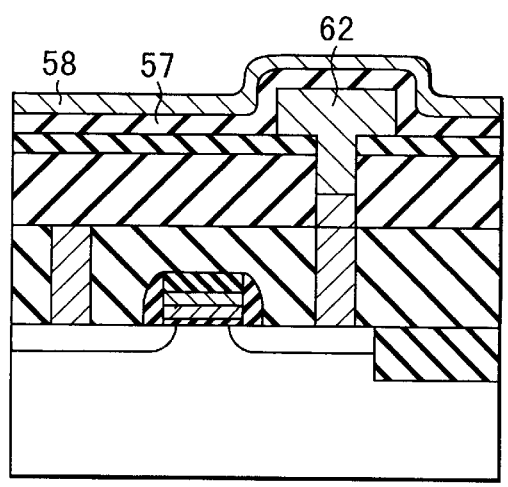

Next, as shown in FIG. 31D, a BST film is deposited as a capacitor insulating film 57 on the whole surface using CVD techniques. Then, on the capacitor insulating film 57, an Ru film is deposited as a PL electrode 58. Thereafter, these films are processed by RIE techniques, thereby forming a capacitor cell.

As described above, with the tenth embodiment, the lower component portion of the SN electrode 62 is formed in such a manner that it self-aligns with the plug 52, which provides a good electrical connection between the SN electrode and the plug. The self-alignment of the lower component portion of the SN electrode with the plug prevents the plug material from being exposed, preventing the plug from being oxidized in forming a capacitor insulating film.

Furthermore, in the tenth embodiment, because the SN electrode 62 is embedded integrally in the contact hole in which the plug 52 has been formed and in the trench of the TEOS film 62 in such a manner that the SN electrode 62 makes a continues film, the strength of the SN electrode is improved.

(Eleventh Embodiment)

FIGS. 32A to 32H illustrate processes of manufacturing a stacked DRAM according to an eleventh embodiment of the present invention. The first half of the process in FIG. 32A correspond to the first half of the process of FIG. 26A in the eighth embodiment.

After a polycrystalline silicon plug 50 and others have been formed in the same processes as those in the eighth embodiment, a BPSG film is deposited as an interlayer insulating film 71 to a thickness of about 300 nm on the whole surface by CVD techniques. Then, a silicon nitride film (or an interlayer insulating film 72) is deposited as an etching stopper in CMP to a thickness of about 50 nm by CVD techniques.

Next, using ordinary lithographic techniques and RIE techniques, a contact hole and trench (not shown) are made in the interlayer insulating films 71 and 72. By embedding conductive material in the contact hole and trench, a bit-line contact and a bit line are formed. The bit-line contact and bit line electrically connect the polycrystalline silicon plug 50 (BL plug) to the bit line. To form the bit-line contact and bit line, what is called a dual damascene process is used and a W film and others are embedded in a line-like trench (with a depth of about 350 nm).

Next, the W film and others embedded in the trench are etched about 100 nm, for example. Then, an SiN film is deposited to a thickness of about 300 nm on the whole surface. By CMP techniques or CDE techniques, an SiN film (not shown) is selectively embedded on the W film and others to make a bit line.

Next, a contact hole reaching the polycrystalline silicon plug 50 (or SN plug) is made in the interlayer insulating films 71 and 72 by ordinary lithographic techniques and RIE techniques. Then, a stacked film of, for example, W film/TiN film/Ti film is deposited on the entire surface. Thereafter, by CMP techniques or the like, the W film/TiN film/Ti film on the interlayer insulating film 72 is removed, thereby embedding the W film/TiN film/Ti film only in the contact hole (hereinafter, the W film/TiN film/Ti film embedded in the contact hole is referred as a W plug). The W plug 73 is electrically connected to the source/drain diffused layer via the SN plug 50. At this stage, the memory cell section is flat.

Figure 32A:
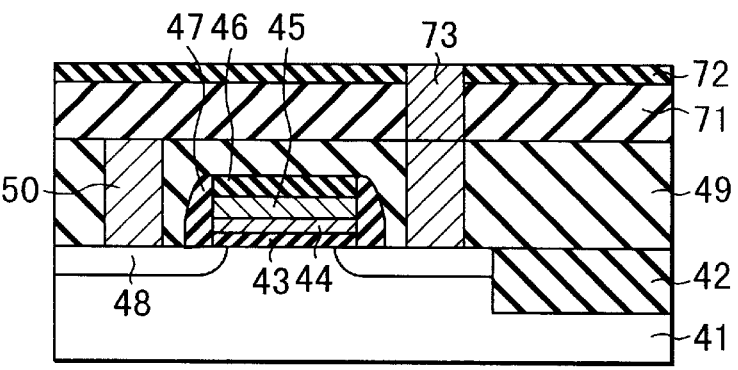
FIGS. 32A to 32H illustrate manufacturing processes according to an eleventh embodiment of the present invention.
Figure 32B:
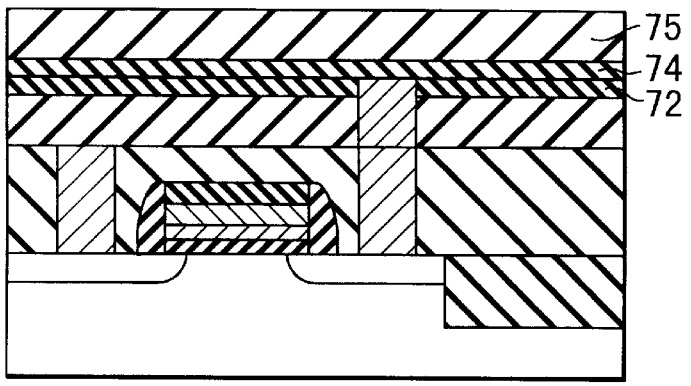

Next, as shown in FIG. 32B, a silicon nitride film 74 is deposited on the entire surface to a thickness of about 20 nm. Then, a TEOS oxide film 75 is deposited to a thickness of about 300 nm on the silicon nitride film 74.

Figure 32C:
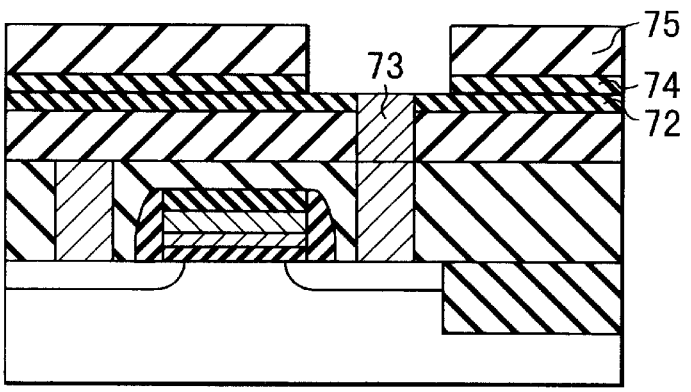

Next, as shown in FIG. 32C, using a resist (not shown) whose SN electrode forming region has an opening pattern as a mask, the silicon nitride film 74 and TEOS oxide film 75 are etched, thereby exposing the surface of the W plug 73.

Figure 32D:
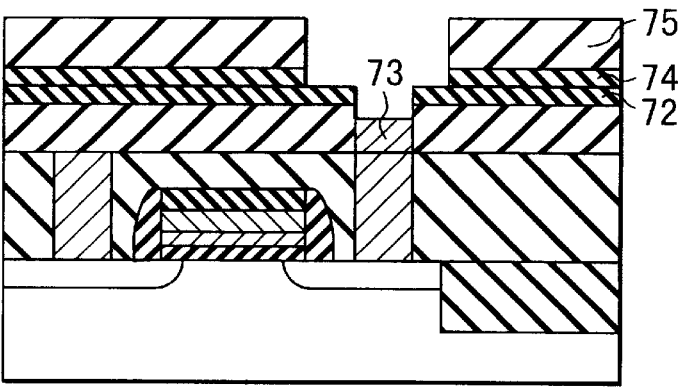

Next, as shown in FIG. 32D, the upper region of the exposed W plug 73 is etched about 100 nm, thereby recessing the surface of the W plug 73 (a recessing process).

Figure 32E:
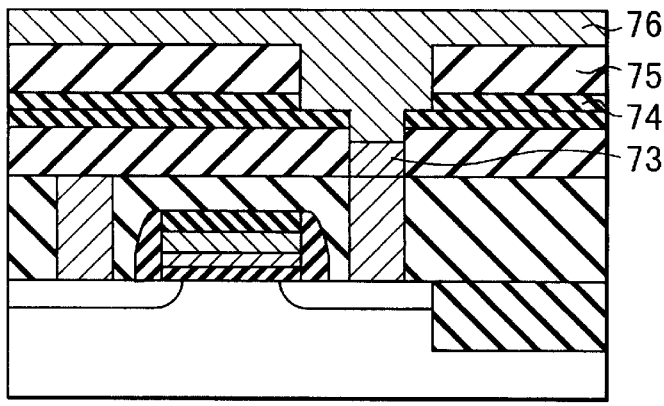

Then, as shown in FIG. 32E, an Ru film 76 to make an SN electrode is deposited to a thickness of about 400 nm by sputtering techniques or CVD techniques.

Figure 32F:
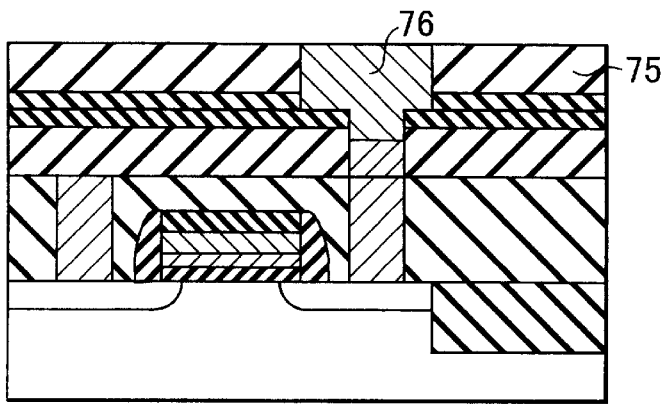

Then, as shown in FIG. 32F, a flattening process is carried out by CMP techniques or etch-back techniques, thereby forming an SN electrode 76.

While the Ru film has been used as material for the SN electrode 76, an $RuO_2$ film, a Pt film, an Re film, an Os film, a Pd film, an Rh film, an Au film, an Ir film, an $IrO_2$ film, or a metal oxide film with a perovskite structure (e.g., $SRO(SrRuO_3)$ film) may be used. Moreover, a film obtained by stuffing the grain of each of these metal films with another metal film (e.g., Rh or Ir) may be used.

Figure 32G:
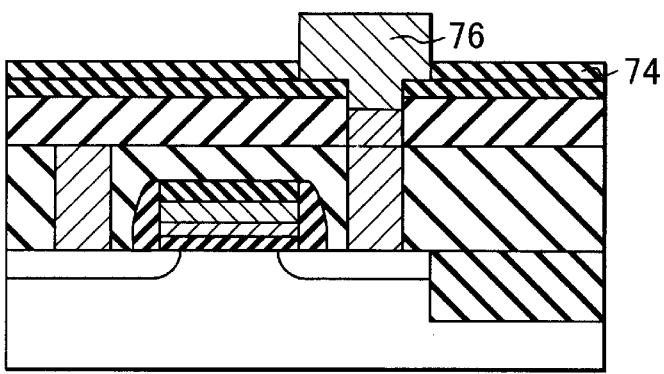

Next, as shown in FIG. 32G, the peripheral circuit section and others are covered with a resist (not shown) and the TEOS oxide film 75 is selectively removed by using a wet etching solution, such as $NH_4F$ solution. At this time, etching can be stopped by the SiN film 74 under the TEOS oxide film 75. The etching process makes the height of the surface of the SN electrode 76 in the memory cell section equal to that of the TEOS oxide film 75 excluding the memory cell section. As a result, a step between the memory cell region and the region excluding the memory cell region is eliminated to a negligible level.

The side faces of the SN electrode 76 are the transfer of the side faces of a trench made by etching the TEOS oxide film 75. Because the etching surface of the flat, smooth TEOS oxide film 75 is transferred onto the SN electrode, the side faces of the SN electrode are made flat and smooth. When metal material is etched to form an SN electrode, the etching surface is hard to control and therefore it is difficult to obtain the flat, smooth side faces of the SN electrode. In the eleventh embodiment, the side faces of the SN electrode are made flat and smooth, which suppresses the concentration of electric field due to roughness of the side faces of the SN electrode. Consequently, it is possible to suppress an increase in the leakage current in the capacitor insulating film.

Figure 32H:
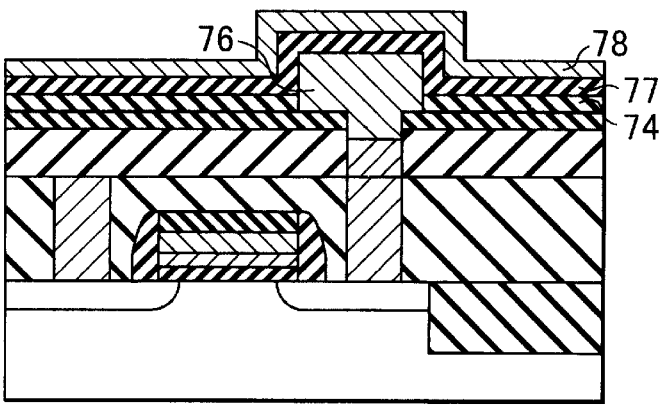

As shown in FIG. 32H, a BST film 77 to make a capacitor insulating film is deposited to a thickness of about 20 nm on the whole surface by CVD techniques. Then, on the BTS film 77, an SRO film 78 to make the upper electrode (plate electrode) of the capacitor is deposited to a thickness of about 40 nm on the entire surface by CVD techniques. Thereafter, on the SRO film 78, a TiN film and others to make a cap film (not shown) is formed to a thickness of about 50 nm by sputtering techniques. After this, the plate electrode 78 and cap film are patterned by ordinary lithographic techniques and RIE techniques.

In addition to the SRO film, a noble metal, such as an Ru film, a Pt film, a Re film, an Ir film, an Os film, a Pd film, a Rh film, or an Au film, may be used as the plate electrode 78. Additionally, a metal oxide film of each of these noble metals may be used. Moreover, a metal oxide film with a perovskite structure may be used.

Thereafter, an interlayer insulating film, such as a plasma TEOS oxide film, is deposited to a thickness of about 400 nm on the whole surface by CVD techniques. Then, the entire surface is flattened by CMP techniques. This eliminates the step between the memory cell section and the peripheral circuit section. Next, a contact hole is made in a desired region and a metal interconnection is formed. Thereafter, layers of contacts and metal interconnections are formed, if necessary. After this, a passivation film and then a pad contact are formed, which completes the DRAM.

The eleventh embodiment produces a similar effect to that in the tenth embodiment. Furthermore, in the eleventh embodiment, because the insulating film is in contact with the side faces near the bottom of the upper component portion of the SN electrode, the concentration of electric field on that portions is suppressed, which decrease leakage current in the capacitor.

(Twelfth Embodiment)

Figure 33A:
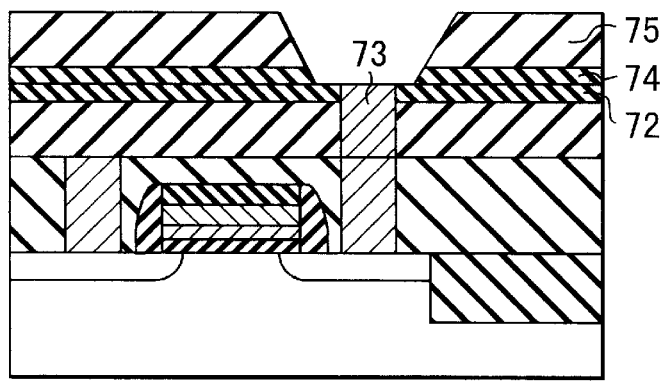
FIGS. 33A to 33C illustrate manufacturing processes according to a twelfth embodiment of the present invention.
Figure 33B:
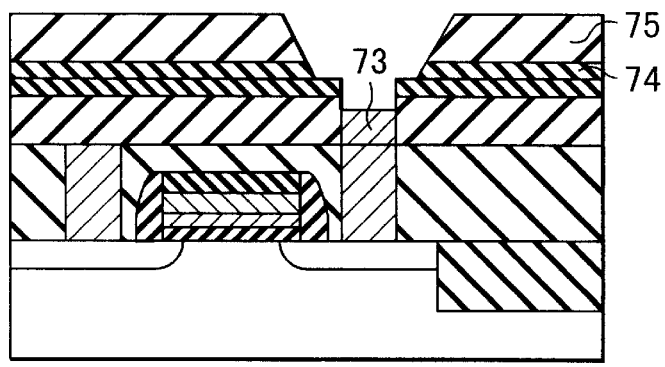
Figure 33C:
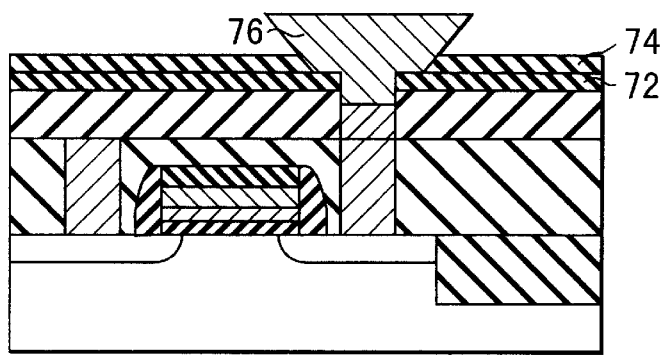

FIGS. 33A to 33C illustrate processes of manufacturing a stacked DRAM according to a twelfth embodiment of the present invention. The basic manufacturing processes are similar to those of FIGS. 32A and 32H in the eleventh embodiment.

In the eleventh embodiment, the holes for the SN electrode and others have been formed almost vertical in the process of FIG. 32C. In the twelfth embodiment, the side faces of the hole are tapered normally by selecting the RIE conditions suitably as shown in FIG. 33A. The processes from this point on are the same as those in the eleventh embodiment. Specifically, the surface of the W plug 73 is recessed by recess etching (FIG. 33B) and then an SN electrode 76 is formed (FIG. 33C).

With the twelfth embodiment, the surface area of the SN electrode is made greater without a short circuit between SN electrodes by tapering the side faces of the SN electrode reversely.

(Thirteenth Embodiment)

Figure 34A:
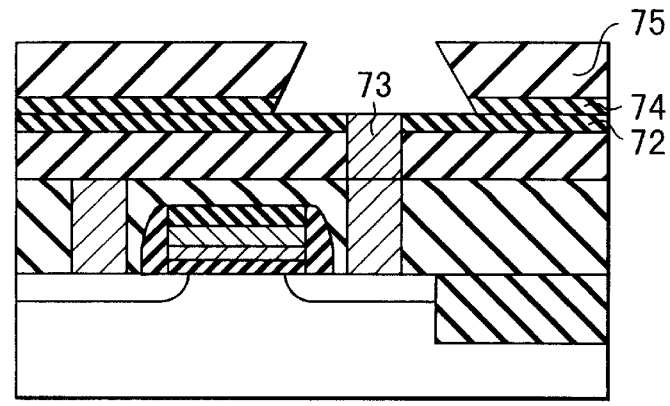
FIGS. 34A to 34C illustrate manufacturing processes according to a thirteenth embodiment of the present invention.
Figure 34B:
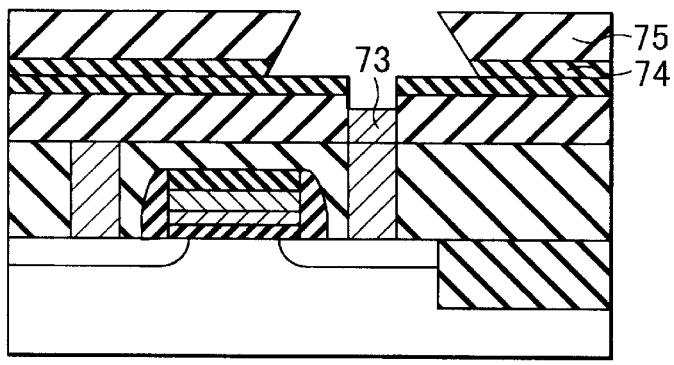
Figure 34C:
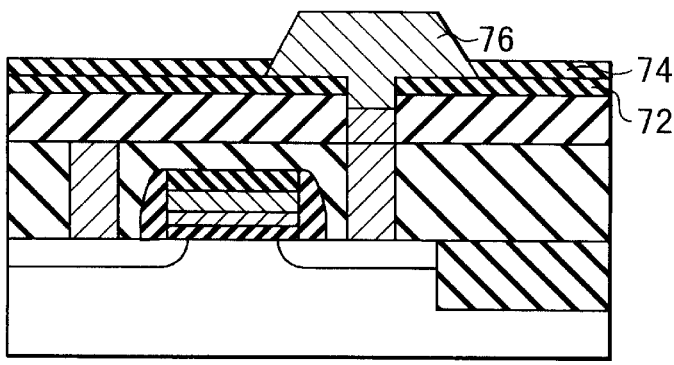

FIGS. 34A to 34C illustrate processes of manufacturing a stacked DRAM according to a thirteenth embodiment of the present invention. The basic manufacturing processes are similar to those of FIGS. 32A and 32H in the eleventh embodiment.

In the eleventh embodiment, the holes for the SN electrode and others have been formed almost vertical in the process of FIG. 32C. In the twelfth embodiment, the side faces of the hole are tapered reversely as shown in FIG. 34A. The reverse tapered shape is obtained by combining, for example, RIE techniques and CDE techniques (and further wet etching techniques, if necessary). The processes from this point on are the same as those in the eleventh embodiment. Specifically, the surface of the W plug 73 is recessed by recess etching (FIG. 34B) and then an SN electrode 76 is formed (FIG. 34C).

With the thirteen embodiment, the surface area of the SN electrode is made greater by tapering the side faces of the SN electrode normally. Although the side faces near the bottom of the upper component portion of the SN electrode have an acute angle, the concentration of electric field at the portions is suppressed because the insulating film are in contact with the portions.

(Fourteenth Embodiment)

Figure 35A:
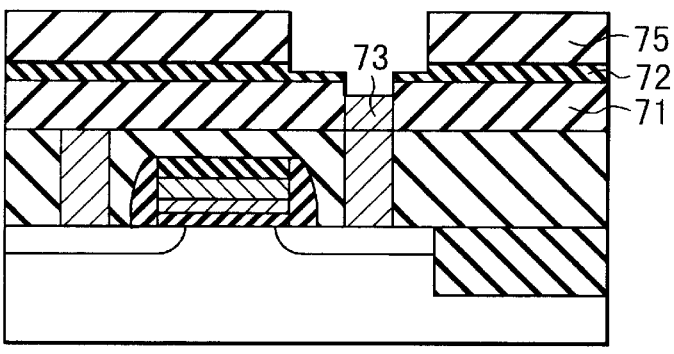
FIGS. 35A and 35B illustrate manufacturing processes according to a fourteenth embodiment of the present invention.
Figure 35B:
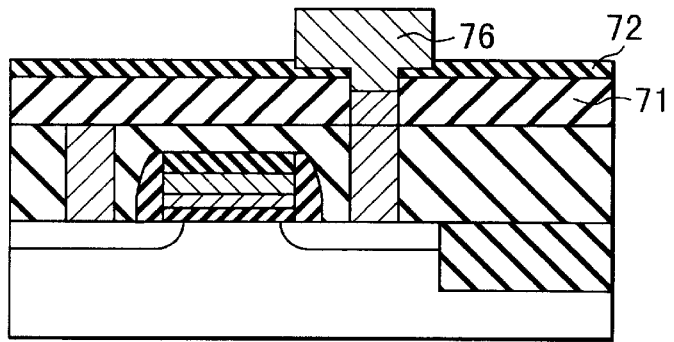

FIGS. 35A and 35B illustrate processes of manufacturing a stacked DRAM according to a fourteenth embodiment of the present invention. The basic manufacturing processes are similar to those of FIGS. 32A and 32H in the eleventh embodiment.

In the fourteenth embodiment, a TEOS oxide film 75 is formed directly on a silicon nitride film 72. Thereafter, in the process of recessing the surface of a W plug 73 by recess etching, the surface of the silicon nitride film 72 is also recessed (FIG. 35A). The processes from this point on are the same as those in the eleventh embodiment. In the subsequent processes, an SN electrode 79 and others are formed (FIG. 35B).

In the fourteenth embodiment, too, because the insulating film is in contact with the side faces near the bottom of the upper component portion of the SN electrode, the concentration of electric field at the portions is suppressed.

(Fifteenth Embodiment)

Figure 36A:
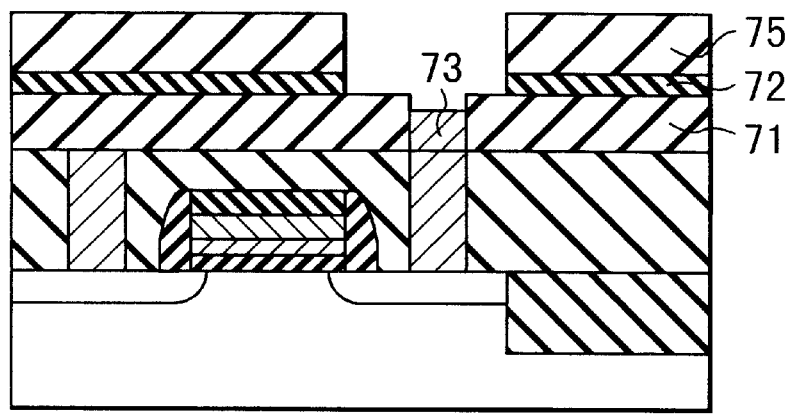
FIGS. 36A and 36B illustrate manufacturing processes according to a fifteenth embodiment of the present invention.
Figure 36B:
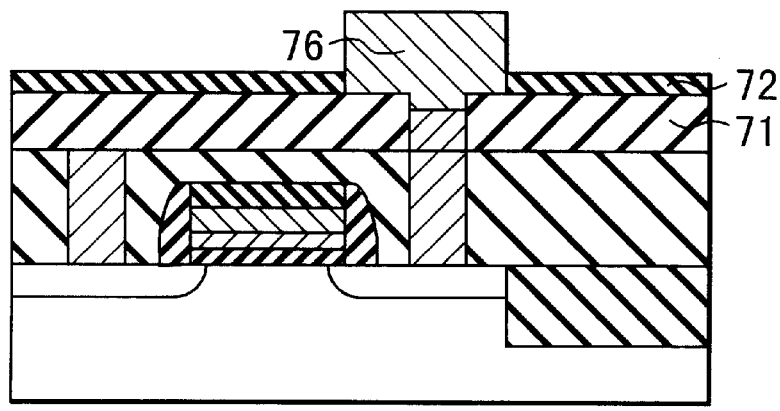
Figure 37:
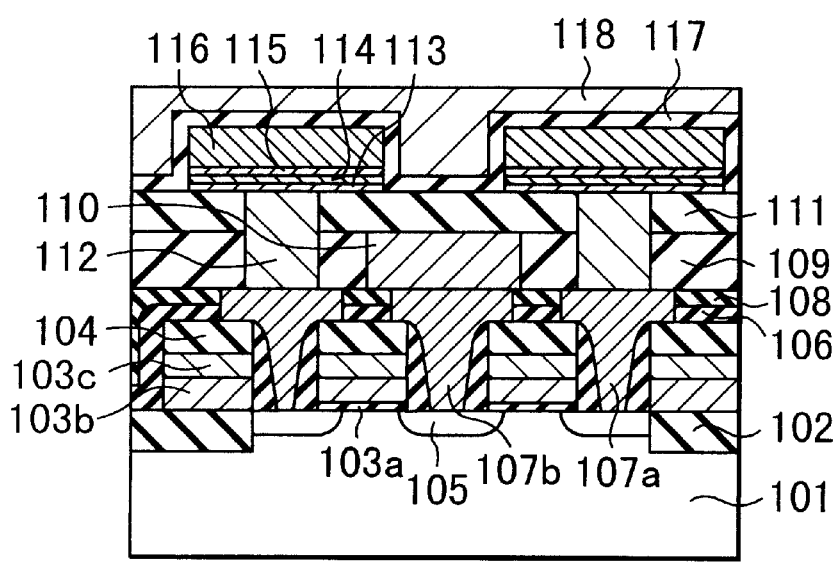
FIG. 37 is a sectional view of a conventional stacked capacitor.

FIGS. 36A and 36B illustrate processes of manufacturing a stacked DRAM according to a fifteenth embodiment of the present invention. The basic manufacturing processes are similar to those of FIGS. 32A and 32H in the eleventh embodiment.

As in the fourteenth embodiment, in the fifteenth embodiment, a TEOS oxide film 75 is formed directly on a silicon nitride film 72. Thereafter, in the process of recessing the surface of a W plug 73 by recess etching, the exposed portions of the silicon nitride film 72 are all removed (FIG. 36A). The processes from this point on are the same as those in the eleventh embodiment. In the subsequent processes, a first SN electrode 76 and others are formed (FIG. 36B).

In the fifteenth embodiment, too, because the insulating film is in contact with the side faces near the bottom of the upper component portion of the SN electrode, the concentration of electric field at the portions is suppressed.

In the eighth to fifteenth embodiments, a TiN film, a TiSiN film, a TiAlN film, or a TaSiN film may be formed as a barrier metal layer between the plug and the SN electrode. In addition, a W film, a Nb film, or a Ti film may be used as a barrier metal layer. A silicide film or nitride film of each of these metals (e.g., a WN film) may be formed. Moreover, an Ru film may be used as a barrier metal layer. The barrier metal layer is formed in such a manner that it is embedded in the trench in which the plug has been formed.

While in the above embodiments, a BST film has been used as the capacitor insulating film, it may be any other suitable high-permittivity insulating film.

For instance, a PZT film, an STO film, or a $Ta_2O_5$ film may be used. As the BST film, an epitaxial BST film may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

the step of forming an insulating film on a substrate in which an MIS transistor has been formed;

the step of removing part of said insulating film to make a hole whose side faces widen gradually as they go downward;

the step of embedding in said hole a conductive film that is connected to one of a source and a drain of the MIS transistor and is to make a lower electrode of a capacitor;

the step of removing said insulating film to expose at least part of the side faces of said conducting film;

the step of forming a capacitor insulating film on the top face of and the exposed side faces of said conducting film; and the step of forming an upper electrode of the capacitor on said capacitor insulating film.

2. The method according to claim 1, wherein the step of removing part of said insulating film to make a hole whose side faces widen gradually as they go downward includes:

the step of making a first hole whose side faces widen gradually as they go downward by removing part of said insulating film; and the step of enlarging said first hole by etching said insulating film, thereby transforming said first hole into a second hole.

3. A method of manufacturing a semiconductor device, comprising:

the step of forming a first insulating film on a substrate in which an MIS transistor has been formed and a second insulating film on said first insulating film;

the step of removing part of said first and second insulating films to make a first hole;

the step of enlarging an upper portion of said first hole by etching said second insulating film with reference to said first insulating film, thereby transforming said first hole into a second hole;

the step of embedding in said second hole a conductive film that is connected to one of a source and a drain of said MIS transistor and is to make a lower electrode of a capacitor;

the step of removing said second insulating film to expose at least part of the side faces of said conducting film;

the step of forming a capacitor insulating film on the top face of and the exposed side faces of said conducting film; and the step of forming an upper electrode of the capacitor on said capacitor insulating film.

4. A method of manufacturing a semiconductor device, comprising:

the step of forming an insulating film with a hole on a substrate in which an MIS transistor has been formed;

the step of forming in said hole a plug connected to one of a source and a drain of said MIS transistor in such a manner that a top face of said plug is positioned between a top and a bottom of said hole;

the step of forming a first conducting film on said plug in said hole;

the step of exposing at least part of the side faces of said first conducting film by removing part of said insulating film;

the step of forming a second conducting film on the exposed side faces of or the exposed side faces and top face of said first conducting film;

the step of forming a capacitor insulating film on a lower electrode of a capacitor composed of said first and second conducting films; and the step of forming an upper electrode of the capacitor on said capacitor insulating film.

5. A method of manufacturing a semiconductor device, comprising:

the step of forming a first insulating film on a substrate in which an MIS transistor has been formed, and a second insulating film on said first insulating film;

the step of removing part of said first and second insulating films to make a first hole;

the step of forming in said first hole a plug connected to one of a source and a drain of said MIS transistor in such a manner that the top face of said plug is positioned at a lower level than a top of said first insulating film and at a higher level than a bottom of said first insulating film;

the step of enlarging an upper portion of said first hole by etching said second insulating film with reference to said first insulating film, thereby transforming said first hole into a second hole;

the step of embedding a conducting film in said second hole, thereby connecting said conducting film to said plug;

the step of exposing at least part of the side faces of said conducting film by removing said second insulating film, the step of forming a capacitor insulting film on the lower electrode of a capacitor composed of said conducting film; and the step of forming the upper electrode of the capacitor on said capacitor insulating film.

* * * * *

UNITED STATES PATENT AND TRADEMARK OFFICE
CERTIFICATE OF CORRECTION

PATENT NO.     : 6,335,241 B1
DATED          : January 1, 2002
INVENTOR(S)    : Katsuhiko Hieda et al.

It is certified that error appears in the above-identified patent and that said Letters Patent is hereby corrected as shown below:

<u>Title page,</u>
Item [57], ABSTRACT,
Line 10, "first constituting portion" should read -- first constituting portion --.
Lines 13-14, "continues" should read -- continuous --.

<u>Column 26,</u>
Line 61, "insulting film" should read -- insulating film --.

Signed and Sealed this

First Day of October, 2002

*Attest:*

JAMES E. ROGAN
*Attesting Officer*    *Director of the United States Patent and Trademark Office*